United States Patent [19]
deRochemont et al.

[11] Patent Number: 5,707,715
[45] Date of Patent: Jan. 13, 1998

[54] METAL CERAMIC COMPOSITES WITH IMPROVED INTERFACIAL PROPERTIES AND METHODS TO MAKE SUCH COMPOSITES

[75] Inventors: L. Pierre deRochemont, c/o $C^2$ Technologies, 37 Towle Farm Rd., Complex 46, Hampton, N.H. 03842; Peter H. Farmer, Long Meadow, Mass.

[73] Assignee: L. Pierre deRochemont, Hampton, N.H.

[21] Appl. No.: 697,739

[22] Filed: Aug. 29, 1996

[51] Int. Cl.⁶ .................. B32B 3/00; B32B 15/00; H01L 29/12

[52] U.S. Cl. .................. 428/210; 428/209; 428/433; 428/539.5; 428/615; 428/620; 428/901

[58] Field of Search .................. 428/209, 910, 428/433, 615, 620, 210, 539.5, 901

[56] References Cited

U.S. PATENT DOCUMENTS

| | | | |
|---|---|---|---|
| 3,869,312 | 3/1975 | Moss et al. | 117/215 |
| 4,071,385 | 1/1978 | Kuris | 156/73.1 |
| 4,267,210 | 5/1981 | Yajima et al. | 427/226 |
| 4,880,770 | 11/1989 | Mir et al. | 505/1 |
| 4,950,643 | 8/1990 | Agostinelli et al. | 505/1 |
| 4,959,507 | 9/1990 | Tanaka et al. | 174/260 |
| 4,981,761 | 1/1991 | Ookouchi et al. | 428/594 |
| 4,987,677 | 1/1991 | Tanaka et al. | 29/846 |
| 5,010,053 | 4/1991 | Maroni | 505/1 |
| 5,024,883 | 6/1991 | SinghDeo et al. | 428/323 |
| 5,104,849 | 4/1992 | Shiga et al. | 505/1 |
| 5,108,026 | 4/1992 | Su et al. | 228/122 |
| 5,113,315 | 5/1992 | Capp et al. | 361/386 |
| 5,153,077 | 10/1992 | Kashiba et al. | 428/627 |
| 5,155,665 | 10/1992 | Komorita et al. | 361/400 |
| 5,251,803 | 10/1993 | Kashiba et al. | 228/124 |
| 5,256,443 | 10/1993 | Tomita | 427/125 |
| 5,318,800 | 6/1994 | Gong et al. | 427/229 |
| 5,342,653 | 8/1994 | Simon et al. | 427/256 |
| 5,363,277 | 11/1994 | Tanaka | 361/760 |
| 5,430,008 | 7/1995 | Morris | 505/150 |
| 5,540,981 | 7/1996 | Gallagher et al. | 428/220 |

FOREIGN PATENT DOCUMENTS

0380115  of 1980  European Pat. Off. .

OTHER PUBLICATIONS

P. Arendt, et al. Fabrication of Biaxially Oriented YBCO ON (001) Biaxially Oriented Yttria–Stabilized–Zirconia On Polycrystlline Substrates. MRS Symposium Proceedings on Epitaxial Oxide Thin Films and Heterostructures, MRS Bulletin 341 (1994).

S. R. Foltyn, et al. Pulsed Laser Deposition of Thick $YBa_2Cu_3O_7-\delta$ Films On Flexible Substrates. Proceedings of the International Workshop on Superconductivity, Jun. 18–21, 1995, Maui, Hawaii.

X.D. Wu, et al. High Current $YBa_2Cu_3O_7-\delta$ Thick Films On Flexible Nickel Substrates With Textured Buffer Layers. Applied Physics Letters 65 (15), 10 Oct. 1994).

S. R. Foltyn, et al. Pulsed Laser Deposition of Thick $YBa_2Cu_3O_7-\delta$ Films with $J_c>1$ $MA/cm^2$. Appeared in Applied Physics Letters, 63 (13), 27 Sep. 1993.

Hiroyuki Nasu, et al. Superconducting Y–Ba–Cu–O Films with Tc>70 K Prepared by Thermal Decomposition Technique of Y–, and cu–2ethylhexanoates. Chemistry Letters pp. 2403–2404 (1987).

(List continued on next page.)

*Primary Examiner*—Cathy F. Lam
*Attorney, Agent, or Firm*—Jerry Cohen

[57] ABSTRACT

A metal-ceramic composite comprised of a metal member bonded to a ceramic oxide member through a covalent bond formed at temperatures less than 880° C., and metal-ceramic composites that are so constructed that to control internal stress or increase crack-resistance within the ceramic member under applied thermal or mechanical loads to the composite, such composite with ferrite or alumina bonded sets of such metal-ceramic computers and end use devices including printed circuit boards, EMI shields and higher level assemblies including such devices.

22 Claims, 14 Drawing Sheets

OTHER PUBLICATIONS

Hiroyuki Nasu, et al. $Ba_24CU_3Or$ films with $T_c(end)>80K$ prepared by the pyrolysis of 2-ethylhexanoates. Journal of Materials Science Letters 7 88 858–260 (1986).

W.J. DeSisto, et al. $YBa_2Cu_3O7-\delta$ thin films deposited by an ultrasonic nebulization and pyrolysis method. Thin Solid Films, 206, pp. 128–131 (1991).

Pierre deRochemont, et al. Fabricating Multifilamentary High-$T_c$ Superconducting Bismuth Cuprate Tapes By Metalorganic Chemical Spray Pryolysis *Applied Superconductivity*, vol. 2, No. 3/4, pp. 281–294, 1994.

METAL CERAMIC COMPOSITES WITH IMPROVED INTERFACIAL PROPERTIES AND METHODS TO MAKE SUCH COMPOSITES

FIELD OF THE INVENTION

The present invention relates generally to certain classes of metal-ceramic composites, and, more particularly, to structural and functional such composites and devices incorporating such composites, including, among others, printed circuit boards, EMI resistant panels and combined printed circuit boards/EMI resistant panel devices.

BACKGROUND OF THE INVENTION

Metal-ceramic composites comprising a metallic member bonded to a ceramic member have many useful applications in areas including, but not limited to, electronic circuits, heat shielding components, structurally-reinforced composite sheeting, engine components, electromechanical actuators or micro-positioners, and electrochemical electrodes. In many of these applications the interface between the metal member and the ceramic member is subject to mechanical stress generated at, or close to, the interface formed between the metal and the ceramic. For instance, preferred combinations of metallic composition and ceramic composition that optimize the performance of an ideal metal-ceramic composite often require an interface to be formed between a metallic composition and a ceramic composition that have poorly matched coefficients of thermal expansion. The composite interface is often susceptible to thermal cycling during the operational mode in these applications. Thus, despite the apparent ability to readily improve performance in the intended application, the actual performance of these metal-ceramic composite structures is unreliable as interfacial stresses developed between metal and ceramic members cause the composite to crack, deform, or delaminate as a result of operational heat cycling. Methods to economically construct metal-ceramic composites with improved interfacial properties, and the composites constructed therewith, are clearly desirable.

Electronic circuits, whether microelectronic circuitry contained or embedded on the surface of a semiconductor chip or an integrated circuit built on a circuit board, generate both heat and electromagnetic field emissions. The more powerful microelectronic circuits used in some of these devices generate significant levels of heat, which can compromise performance efficiency in units lacking efficient thermal management systems. Metal-ceramic composite structures have been used for thermal management, implemented either as a printed circuit board or as an integral member of an electronic package (both referred to herein as "printed circuit boards"). Mismatch in the linear coefficients of thermal expansion at the interface(s) between the differing metal and ceramic materials can result in cracking within or delamination of the composite structure, leading to the eventual failure of the thermal management system.

In many instances, the electromagnetic field emissions generated by these devices can disrupt the proper functioning of nearby electronic equipment and/or be harmful to human safety. As an example, electromagnetic radiation emitted from an operating electronic device, such as a cellular telephone, is known to interfere with the proper functioning of the avionics instrumentation on-board modern aircraft in a manner that risks catastrophic consequences in flight. Diagnostic testing on cellular telephones has shown that the electromagnetic field emissions of one unit operated in close proximity to another unshielded unit can trigger communications failure. Additionally, the perception exists among some in the health sciences community that electromagnetic field emissions may actually alter cellular metabolism in a harmful way within a small, but measurable, percentage of the human population. As a result, cellular telephones, which typically emit electromagnetic radiation at power levels of 600 milliwatts (mW) in close proximity to the human brain, may directly threaten human health if these emissions are actually demonstrated to harm human tissue. It is often advantageous to minimize the size and weight of electronic systems by integrating multifunctional performance into subsystems contained in the total systems package. Methods that can simultaneously protect sensitive electronic systems from disrupting electromagnetic interference or that shield human tissue from harmful electromagnetic emissions and contribute to the thermal management of electronic systems and/or provide printed circuit board functionality in a reliable manner are, therefore, desirable.

Improved interfacial properties between metal and ceramic members can also benefit many other areas, such as in electrochemical processing. Many electrochemical processes must be driven at high temperature. In such instances it is advantageous to utilize metal-ceramic composite electrodes that simultaneously conduct ions and electrons because of the ceramic member's higher oxidation- and corrosion-resistance. Mismatch in the linear expansion of the ceramic member and the metallic member of the electrochemical electrode during thermal cycling will eventually degrade the useful function of the component, since cracks which develop in the ceramic member provide a conduit through which corrosive elements can attack the metal. Metal-ceramic composites also have been contemplated for use as components in automotive and jet engines. These applications can subject the composite part to extreme changes in body temperature, as well as sharp temperature differentials across the body of the composite part itself. Poor interfacial characteristics can limit the performance of the engine part. Interfacial stress at a metal-ceramic interface are not limited to mechanical stresses that are thermally induced through a mismatch in linear-expansion-coefficients. Metal-piezoelectric ceramic interfaces are now widely applied in electromechanical actuators and micro-positioners. In these electromechanical applications, the metal member is used as an electrode to convey a voltage across the piezoelectric ceramic, which, in turn, will expand (or contract) along the ceramic's crystallographic axis that is normal to the plane defining the metal-ceramic interface. Concurrent with the longitudinal expansion (contraction) in the ceramic, the piezoelectric ceramic will simultaneously contract (expand) laterally along crystallographic orientations parallel to the plane defining the metal-ceramic interface. Linear expansions in high-performance piezoelectric ceramics can be as high as 1%, which is roughly equivalent to the linear thermal expansion generated by a 1000° C. change in temperature. Likewise, a composite sheet used as a lightweight structural component, comprised of a ceramic sheet member bonded to a metallic sheet member, wherein the ceramic member provides greater structural integrity or rigidity to the metal member, will be subject to a variety of mechanical loads and forces that stress the interface between the ceramic and metallic members.

Thus, methods that can be widely applied to improve the performance of bulk metal-ceramic composites subjected to extreme linear expansions along at least one interface formed between the metal member and the ceramic member in metal-ceramic composite are, therefore, also desirable.

The following patents are listed as examples of the prior art: Kashiba et al, U.S. Pat. Nos. 5,153,077 and 5,251,803; Komorita et al, U.S. Pat. No. 5,155,665; Tanaka et al, U.S. Pat. Nos. 4,959,507 and 4,987,677; Ookouchi et al, U.S. Pat. No. 4,981,761; Suet al, U.S. Pat. No. 5,108,026; Simon et al, U.S. Pat. No. 5,342,653. The publications of A. Goldman, in "Modern Ferrite Technology," Van Nostrand Rheinhold, New York, USA (1990) and A. J. Baden Fuller, in "Ferrites at Microwave Frequencies," Peter Peregrinus Ltd., London, U.K. (1987) provide reference literature on the physical properties of ferrite ceramics at low and microwave frequencies. Aspects of these references will be also described further in the Detailed Description of the present invention.

It is therefore an object of this invention to provide a metal-ceramic composite of a metal member bonded with a ceramic member, which may either be a dense or porous ceramic, preferably an oxide, wherein the bonding is formed through a covalent bond at temperatures less than a eutectic point for a phase diagram of a metal component of the ceramic layer or its precursor and the metal of the metal layer.

It is a still further object of this invention to exploit the low-temperatures at which a bond can be formed between the ceramic oxide member and a high thermal conductivity or electrical conductivity metal member.

It is a still further object of the invention to provide enhanced metal-ferrite ceramic panels for EMI (electromagnetic interference) blocking or attenuation and devices employing such composites.

It is a further object of the invention to provide enhanced alumina ceramic-metal-ferrite ceramic composites and devices employing such composites.

It is a still further object of this invention to provide metal-alumina ceramic composite substrates for printed circuit board applications.

It is a still further object of this invention to provide a dispersion of secondary phase material particles in the ceramic member to increase the crack-resistance of the ceramic member.

It is a still further object of this invention to provide a metal-ceramic (preferably oxide ceramic) composite such that the ceramic member contains a compositional gradient, and a corresponding gradient in its coefficient-of-thermal-expansion, that reduces shear stress in the ceramic member when the metal-ceramic composite is subjected to a thermal load.

It is a still further object of this invention to provide increased crack-resistance by constructing the metal-ceramic (preferably oxide ceramic) composite oxide such that the ceramic is in a state of compressive stress.

It is a still further object of this invention to provide a construction of a metal-ceramic composite in which adhesion-resistant bodies have been placed at the interface between the metal member and the ceramic oxide member to control the fracture mechanics of the metal-ceramic composite interface.

It is a still further object of this invention to provide a construction of micro-mechanical structures in the ceramic oxide member at the interface with the metal member to increase the flexure in the ceramic oxide member at the interface when the metal member expands or contracts.

SUMMARY OF THE INVENTION

The method and products of the present invention overcome many of the problems associated with the production of past metal/ceramic components. The examples of the present invention stated below under "Detailed Description of Preferred Embodiments" are provided for illusrative purposes and not to limit the scope of the invention.

The invention involves deposition of a metal precursor to a ceramic composition (e.g. ceramic oxide such as $Al_2O_3$ or other single or mixed oxides, borides, carbides, nitrides, silicides) on a metal substrate at a molecular level as a finely divided form of highly adherent metalorganic compounds followed by pyrolysis.

The overall process is conducted at low temperature and involves the method of metalorganic chemical spray pyrolysis. Using this method, metal precursors to the ceramic oxide composition are introduced as metalorganic salt complexes, (i.e., metal complexes having organic ligands), into an organic solvent. Together they form the metalorganic precursor solution. High molecular weight carboxylic acid salts, such as 2-ethylhexanoates, or naphthenates, are the preferred metalorganic species using the process. In solution, the various ceramic precursors are mixed at the molecular level and thus, in minutes, achieve a state of ultrafine subdivision that typically is only achieved after calcining a slurry of powder precursors for many hours. Ceramic precursors are generally introduced into the metalorganic solution in concentrations in the range between 0.05% and 25% equivalent-weight oxide (eq.-wt %), although precursor concentrations in the range of 1% and 20% eq.-wt % are preferred. The spray conditions can be adjusted for compositional (and physical property) uniformity throughout the thickness of the eventual ceramic layer or for graded or otherwise differentiated composition and properties, e.g. graded coefficient of thermal expansion.

This state of ultrafine subdivision among the precursors is retained when the metalorganic solution is nebulized into an aerosol mist and deposited as a ceramic oxide (or the like) on the surface of a heated substrate. The substrate surface must be heated to a temperature that is greater than the boiling point of the organic solvent, which evaporates during ceramic deposition, and at least greater than the decomposition temperature of the organic ligand that is most sensitive to thermal decomposition and contained in the metalorganic salt complex that, too, is most sensitive to thermal decomposition. It is prefered to heat the substrate to a temperature that is at least equivalent to the decomposition temperature of the organic ligand which is most sensitive to thermal decomposition and contained in the metalorganic complex which is least sensitive to thermal decomposition. Carboxylic acid salt precursors are preferred because of their low volatility. Carboxylic acids typically form waxy solids that will thermally decompose rather than evaporate.

During pyrolysis in an ambient oxygen atmosphere, the metalorganic precursors decompose into highly energetic metal radicals that rapidly seek to form covalent bonds with an unbound electron. Heated substrate surfaces comprise a sheet of dangling bonds that are also excited to form a lower energy bond with the metal radicals of the decomposing metalorganic salt complex. Metalorganic salt complexes typically decompose over a temperature range of 250°–450° C. This process thus allows a covalent bond to be formed between the deposited ceramic material and a heated metal member at a low temperature in the range of 250°–450° C. The deposited ceramic retains the state of ultrafine subdivision achieved in the metalorganic solution because the rapid pyrolysis of the precursor droplet, cooled by adiabatic expansion during aerosol nebulization, occurs at such a high rate that the mixed precursors have little or no time to segregate and sequentially decompose as individual metal oxide species.

The ceramic deposited on the heated metal substrate is initially porous and comprised of a solid solution with randomly oriented crystalline structure. The deposited ceramic member can be brought into a physical state comprised of highly oriented and densely packed crystalline grain structure using multiple short duration sequential reaction and mechanical pressurization processing steps. The density of ceramic so-processed can achieve levels approaching 97% and preferrably, for many applications over 99% of theoretical density.

For example, one aspect of the present invention provides for the dispersion of secondary phase material particles in a ceramic medium in order to increase the crack resistance of the ceramic medium.

Another feature of the present invention provides for a thermally insulating ceramic member to be deposited on the metal member by spray pyrolyzing a solution of metalorganic precursors and thus permits the composition of the ceramic member to be altered by adjusting the precursor concentration of the metalorganic solution with the thickness of the deposited ceramic. This reduces shear stress in a ceramic member of a thermally loaded metal-ceramic composite by introducing, as stated above, a composition profile in the ceramic member bonded to the metal member in order to produce a gradient in the coefficient-of-thermal-expansion within the ceramic member in a manner that reduces shear stress in the ceramic member.

The present invention, by virtue of being a low-temperature manufacturing process, also represents a further improvement over the prior art because it allows a far greater selection of constraining metal members than the prior art. Further, the ability to form a covalent bond between the deposited ceramic member and the metallic substrate without a molten bonding agent or adhesive, as is enabled under the present invention, permits even greater improvement over the prior art by introducing stress-reducing micromechanical elements to the ceramic layer throughout in the thickness and/or near the metal-ceramic interface, such elements substantially retaining their compositional and physical integrity.

Another particular aspect of the metal-ceramic composites of this invention relates to the use of the metal-ceramic composites as a metal-ceramic composite substrate for printed circuit boards. Also under the present invention, high conductivity metal-alumina-high conductivity metal, such as copper-alumina-copper structures, with improved crack-resistance and interfacial properties are produced by depositing an alumina-based ceramic on the high conductivity metal member.

Another particular effect of the invention relates to the production of EMI resistant panels or combinations of EMI resistant panels/printed circuit boards.

In making complete metal-ceramic-metal printed circuit boards, it is preferred to separately produce single metal-ceramic composites and bond them, ceramic face to ceramic face, with heat/pressure assisted self bonding or via an intermediate layer.

Under certain processing conditions, the surface texture of one or both the ceramic-faces of metal-ceramic composites bonded together ceramic-face to ceramic-face can become grossly undulated. This is particularly true with hard ceramic compositions, such as alumina ceramic. In such instances, the excessive surface roughness may create problems when forming the low-melting temperature oxide bond, or cause the ceramic member sandwiched between the metal members and/or the final composite to have unacceptably non-uniform thickness. In these cases, one can grind the surface of the bonded ceramic face(s) prior to bonding. Surfaces with controlled roughness will generally produce better bonding. It is recommended, but not strictly necessary, to produce a ceramic-face bonding surface that has a mean surface roughness of 25–50 microns, and a maximum surface roughness of 40–100 microns. Ground surfaces with controlled surface roughness can be produced using a variety of techniques, such as abrasion blasting, that are well known to practitioners skilled in relevant art.

EMI resistant panels mentioned above involve use of ferrite ceramics, e.g. $PbO+Fe_2O_3 \rightarrow PbFe_2O_4$ of spinel or inverse spinel crystallographic structures. The ferrite grains are grown to over 2.5 micron size (usually anisotropic) preferrably 10 to 30 micron size in most applications to enhance EMI absorption.

Where printed circuit boards and EMI resistant panels are combined in a laminated structure separate functional ceramic layers can be provided, e.g. separate ferrite and alumina layers, as hereinafter described (with respective optimum grain size, e.g. 2.5 micron plus for the ferrite and 0.5–2 micron size for the alumina and slight differences of density e.g. 97%>plus of theoretical for ferrite and 99% plus for the alumina). One or more of the various aspects of crack propagation limitation and/or layer to layer physical property accommodation cited above can be applied, all consistent with the ceramic-metal interfacial characteristics described herein.

For a better understanding of the present invention, together with other and further objects, reference is made to the following description taken in conjunction with the accompanying drawings, in which:

BRIEF DESCRIPTION OF THE DRAWINGS

FIGS. 6 (b) and 6 (c) represent a model that visually simulates the thermal deformation in a metal-ceramic composite substrate printed circuit board and compares thermal deformation in the composite when the mounting area contains a molybdenum constraining-metal member to the thermal deformation in the composite when the mounting area contains a titanium constraining-metal member.

DETAILED DESCRIPTION OF PREFERRED EMBODIMENTS

Figure 1:
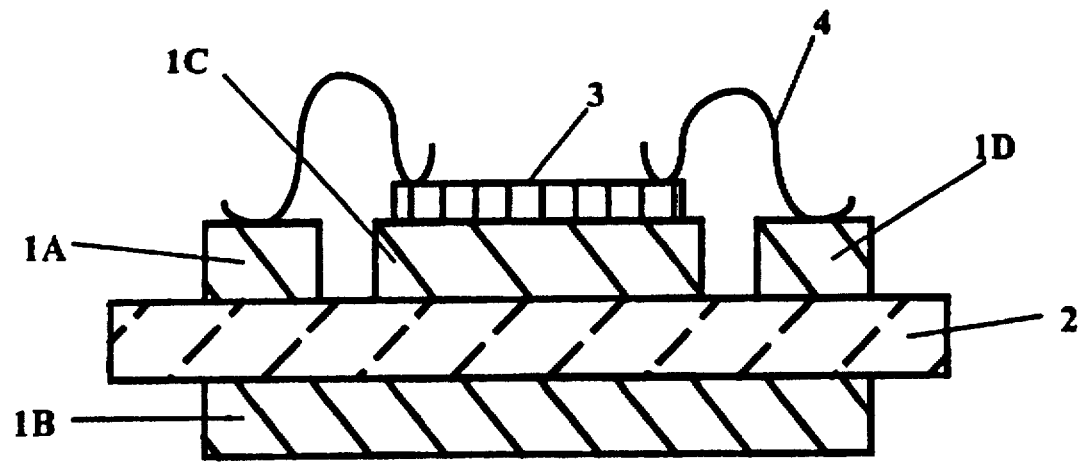
FIG. 1 is a cross-sectional representation of a metal-ceramic composite printed circuit board as found in the prior art.

The following brief analyisis is provided in order to better understand the present invention. In addition, a number of terms used throughout this description are also provided below.

The term "ultrafine subdivision" is understood to represent a ceramic whose precursors have been mixed at the molecular level, as in a solution, as opposed to a ceramic whose precursors were mixed as particulates with a definitive particle size, as in a slurry. The term "secondary phase material" is understood to represent a compositional state of matter dispersed in a ceramic deposited or formed on a metal member, such that the "secondary phase material" is characterized by an elemental composition, material phase, or crystallographic structure that is different from the deposited ceramic into which it is dispersed. The "secondary phase material" may be a single crystalline phase, a ceramic phase, a glass phase, graphite, a metal phase, a shape-memory alloy phase, or any composite form of said material phases that produces a Young's modulus that is less than the Young's modulus of the ceramic medium into which the "secondary phase material" has been dispersed. The term "shape-memory alloy" is understood to represent a metallic phase or glassy metallic phase that exhibits superior ductile properties under mechanical stress and the ability to return to its initial geometric shape and physical dimensions exhibited in an unstressed state after the application of said mechanical stress has been relieved.

Composite bodies that comprise a ceramic member contacted to a metallic member can significantly improve the performance of a conventional non-composite part over a wide range of applications. In practice, however, unless special measures are taken to engineer a proper interface between the ceramic member and the metal member, the functionality of the composite bodies can be extremely limited as the intended applications often subject the composite bodies to thermal loads or mechanical stress that cause the metal and ceramic members to become mutually incompatible in a single composite body. Metals and ceramics are essentially characterized by starkly different chemical, mechanical and thermal properties. Metals are, typically, characterized by ductile properties that permit them to elastically flex and accommodate a higher degree of mechanical stress prior to reaching a point inelastic fracture. Metals, typically, exhibit thermal conductivities that are superior to those common to most ceramics. Ceramics, typically, are characterized by rigid mechanical properties that allow them to resist flexure, however, this brittle nature can make the ceramic more susceptible to inelastic fracture under equivalent mechanical loads. A composite body, comprised of a metal member bonded to a ceramic member can blend the superior properties of each member to improve device performance in a variety of applications.

The ultimate performance in such a composite body will, in many instances, be determined by stresses generated at, or close to, the interface between the ceramic member and the metallic member, where the disparate thermal and mechanical properties of one member will oppose the other member's natural response to an applied thermal or mechanical load beyond its natural ability to do so. An example of a failure mode in a metal-ceramic composite body is easily demonstrated when a typical composite body is subject to strong variations in temperature, and/or large temperature differential across the composite body itself, and the metal-ceramic interface in particular. Under such circumstances, applications failure typically relates to interfacial stress caused by the mismatch in the coefficients of thermal expansion between the ceramic member and the metal member. When both members are restrained at the interface, a simple expression, using the product of the Young's modulus, E, [E=Newtons/mm$^2$], the coefficient-of-thermal-expansion, $\alpha$ [$\alpha$=K$^{-1}$ (in.(cm)/in.(cm)–°K)], and the temperature differential to which $\Delta T$, [$\Delta T$]=K, can be used to assess the thermal dependence of interfacial stress, $\Delta S$:

$$\Delta S = KE\alpha_{ceramic}\Delta T \tag{1}$$

where, $$K=(1-\alpha_{metal}\Delta T_{metal}/\alpha_{ceramic}\Delta T_{ceramic})/(1+A_{ceramic}E_{ceramic}/A_{metal}E_{metal}) \tag{1a}$$

and, A represents the area of the subscripted member.

Figure 2:
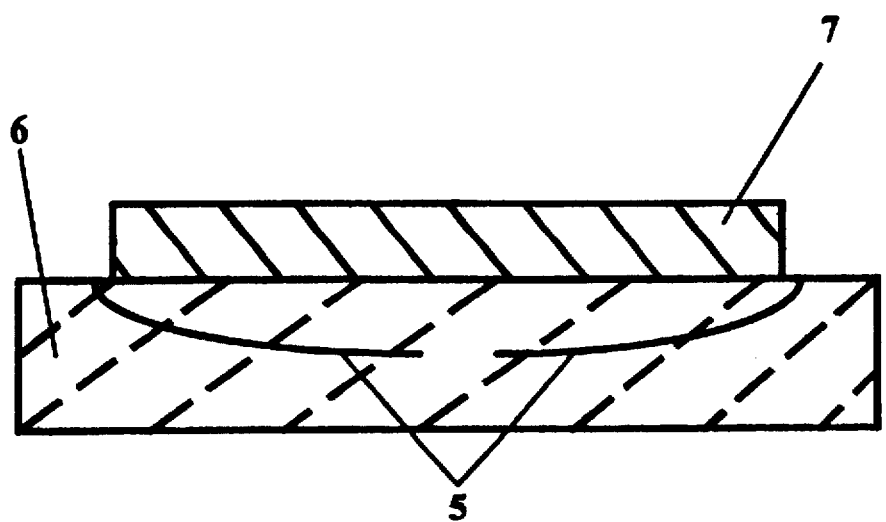
FIG. 2. represents a cross-sectional view of a typical fracture pattern for a metal-ceramic composite interface that has been thermally overstressed in a typical printed circuit board as shown in FIG. 1.

It is straightforward to evaluate the thermal incompatibility of pertinent metal-ceramic composite bodies. For instance, as shown in FIG. 1 of the drawings, printed circuit boards for high power semiconductor integrated circuits ("SIC's") generally comprise a metal-ceramic composite susbtrate consisting of a low-cost, high thermal conductivity, high electrical conductivity metal sheet 1A bonded to a low-cost, low-dielectric constant, low thermal conductivity ceramic 2 on one major surface of the ceramic, with another low-cost, high thermal conductivity, high electrical conductivity metal sheet 1B bonded to the ceramic's opposing major surface. In the printed circuit board application, the metal sheet 1A will be etched to form a network of mounting areas 1C, onto which semiconductor integrated circuits 3 are mounted, and electrode areas 1D, that are used to transport electrical signals across the surface of the printed circuit board. Aluminum wire 4 is ultrasonically bonded between the SIC 3 and the electrode area 1D to electrically connect the semiconductor chip to the electrode network on the surface of the printed circuit board. Prior art has typically used aluminum oxide (alumina) as the ceramic member 2 and copper as the metal sheets 1A and 1B, although it is possible to use other metals and ceramics, such as non-oxide ceramics, to form the printed circuit board structures. Copper has a coefficient-of-thermal-expansion of $\alpha_{copper}=16.5\times10^{-6}$ $K^{-1}$, and a Young's modulus of $E_{copper}=11\times10^4$ (Newtons)/mm², whereas the coefficient-of-thermal-expansion for alumina ceramic is $\alpha_{ceramic}=8.8\times10^{-6}$ $K^{-1}$, and it has a Young's modulus of $E_{ceramic}=160-300$ (Newtons)/mm². Using equation (1), it is straightforward to determine that approximately 2 megapascals (MPa) of stress will be generated for each degree of rise and fall in temperature at the interface formed when alumina ceramic is directly bonded to copper metal. This means that a 10°–15° K (°C.) rise or fall in temperature will bring the alumina ceramic to a point of internal fracture. FIG. 2 shows a fracture pattern that is typical of an over-stressed interface, comprising cracks 5 in the ceramic member 6 that is bonded to the metal member 7. Semiconductor integrated circuits are generally required to operate reliably over temperatures ranging from –40° C. to 150° C. It is, therefore, essential that the metal-ceramic composite, when used as a printed circuit board substrate on which SICs are mounted, have reliable function over an identical range of temperatures. Simple metal-ceramic composite structures, wherein metals having a coefficient-of-thermal-expansion comparable to that of copper are directly bonded to the ceramic member are not sufficient to satisfy these requirements.

In order to achieve reliable function as a printed circuit board, it is also necessary that the metal member on which semiconductor integrated circuits are mounted satisfy other physical tolerances related to surface roughness and Vickers hardness. Tanaka et al. disclose, in U.S. Pat. Nos. 4,959,507 and 4,987,677, that the unit failure rate of metal-ceramic composite substrate circuit boards, wherein the composite substrate circuit boards comprise copper sheets bonded through the eutectic bonding process to the opposing major surfaces of a ceramic member, can be reduced if surface roughness of the copper sheet of the metal-ceramic composite onto which electronic circuits are mounted has a median surface roughness not greater than 3 microns and a maximum surface roughness not greater than 18 microns. Although, the specifications for surface roughness are sufficient, copper members having median surface roughness not greater than 1 micron and a maximum surface roughness not greater than 8 microns are preferred. The reduced surface roughness improves the quality of a solder bond between the semiconductor integrated circuit and the metal surface comprising the mounting area of the metal-ceramic composite substrate onto which it is mounted. Komorita et al. (U.S. Pat. No. 5,155,665) disclose that the unit failure rate of metal-ceramic composite substrate circuit boards, wherein the composite substrate circuit boards comprise copper sheets with the copper sheets bonded through the eutectic bonding process to the opposing major surfaces of a ceramic member, can be reduced if the Vickers hardness of the copper sheet onto which microelectronic circuits are eventually mounted lies in the range of 40 Kg/mm² to 100 Kg/mm². Aluminum wire that is ultrasonically bonded to copper sheets with a Vickers hardness less than 40 Kg/mm² is prone to rupture in the vicinity of the bond, as the ultrasonic energy used in the bonding process is sufficient to bury the wire into the soft copper sheet and catastrophically elongate the aluminum wire. An ultrasonic bond formed between aluminum wire and a copper sheet with a Vickers hardness greater than 100 Kg/mm² frequently has poor adhesion as the ultrasonic wave is attenuated in the hard copper sheet. Metal-ceramic composite substrates that have copper mounting areas with a Vickers hardness in the range between 60 Kg/mm² to 80 Kg/mm² are preferred in printed circuit board applications.

Interfacial stress at a metal-ceramic composite interface can be reduced if the metal member bonded to the interface contains a constraining-metal member which acts to restrain the linear thermal expansion of the metal member. Kashiba et al., describes in U.S. Pat. Nos. 5,153,077 and 5,251,803 the use of a constraining-metal member integrally-bonded into a metal-ceramic composite substrate, wherein the constraining-metal member reduces thermally-generated mechanical stress at the interface between metal and ceramic members in the composite structure, or between the metal layer and a semiconductor integrated circuit mounted on the metal member. In addition to having a lower coefficient-of-thermal-expansion, the constraining-metal layer must have a higher yield strength than the copper sheet to which it is bonded. Copper has a yield strength of 10 Kg/mm², whereas molybdenum, a suitable constraining-metal member, has a yield strength of 50 Kg/mm². The ductile copper, restrained by the constraining-metal member, will not crack as its elastic properties absorb the stress generated by linear expansions at the copper-constraining-metal interface during thermal cycling. The ceramic member in such a metal-ceramic composite structure is subject to a reduced level of mechanical stress as thermally generated linear expansions of the modified metal member are determined by the constraining-metal member's coefficient-of-thermal-expansion. Thus, a constraining-metal modified metal-ceramic composite comprising an alumina ceramic, $\alpha_{ceramic}=8.8\times10^{-6}$ $K^{-1}$ and $E_{ceramic}=160-300N/mm^2$, and molybdenum as the constraining-metal member, $\alpha_{molybdenum}=5.43\times10^{-6}$ $K^{-1}$ and $E_{molybdenum}=33.1\times10^4 N/mm^2$, will experience 0.7 MPa of stress for each degree of rise and fall in temperature, according to equation (1). This means that a 30–45 K (°C.) rise or fall in temperature will bring the alumina ceramic to a point of internal fracture. While this represents a substantial improvement over metal-ceramic composites that do not contain constraining-metal layers, improvements upon the prior art are clearly desirable for semiconductor applications, as well as other applications in which the metal-ceramic composite is subjected to even greater thermal or mechanical loads.

The present invention provides methods to improve the thermal and mechanical integrity of metal-ceramic composites that have at least one interface in which the composite's metal member is directly bonded to the ceramic member. These improvements to the prior art relate specifically to the construction methods used to assemble the metal-ceramic composite. Additionally, the present invention improves the interfacial properties and fracture mechanics of metal-ceramic composites by allowing more fracture-resistant forms of alumina ceramic to be assembled into the composite and by adding micro-mechanical features to the bonding surface of the ceramic member in contact with the metal member that increase the flexure of the ceramic member in response to linear expansions or contractions of the metal member. The present invention also introduces methods to control the fracture mechanics of the interface.

Another significant attribute of the present invention is that it allows the metal-ceramic composite to be formed at much lower processing temperatures. Prior art construction methods utilize pre-fabricated ceramic and metal members that are bonded together using processing techniques that subject the metal-ceramic composite to temperatures at least in excess of 900° C. It is well known to practitioners skilled in the art of heat-treating sheet metal that prolonged exposure to elevated temperatures close to the melting point of the metal sheet, i.e., within 200° C. of its melting point, will reduce its hardness. The degree to which the hardness is reduced is a function of both the temperature as well as the time period over which the metal sheet is exposed to the elevated temperature. Increasing the time period over which the metal is exposed to an elevated temperature sufficient to soften the metal will proportionally reduce its hardness.

The present invention further improves upon the prior art by being a low-temperature process and one that can be suitably engineered for continuous production. These processing features not only impact the ease with which metal-ceramic composites can be produced, they also increase the economy of industrial production. Methods detailed in the prior art represent batch production techniques, in which production units are produced in units of one, or multiples of one depending on batch size. This means all the component parts to the finished product need to be prepared to unit size prior to assembling the final product. Batch production methods are less efficient because they generally represent multiple processing and quality assurance steps for each of the components during sub-assembly prior to forming the finished good in final assembly. Continuous production methods improve the economy of an industrial process by reducing the number of processing steps and increasing production rate. As detailed below, the present invention can be easily engineered into a continuous process. Metal-ceramic composite substrates for printed circuit board applications are easily assembled by rolling copper sheet into a deposition chamber where a layer of alumina ceramic is spray-pyrolyzed onto its surface to form a sheet comprising a metal layer bonded to a ceramic layer. Two such sheets, or one sheet folded onto itself, are joined through a mechanical swaging step, ceramic face to ceramic face, to form the metal-ceramic-metal composite substrate structure. Finished products are then stamped out of a continuously processed sheet. By virtue of the present invention comprising a low-temperature continuous process, it is not necessary to start with excessively hardened copper sheets to achieve metal-ceramic composite substrates in which the copper mounting and electrode areas satisfy hardness tolerances necessary to produce a reliable printed circuit board. Since all the bonding steps utilized under the present invention can be realized at temperatures below 900° C., hardness reduction during subsequent annealing steps is mitigated by lower temperature processing, providing more control over the Vickers hardness of the metal members in the finished composite.

An essential feature of the present invention is that it allows a ceramic member to be bonded to any metal member, irrespective of metal and ceramic composition(s), through a covalent bond formed using processing temperatures that can be less than 500° C. More specifically, ceramic oxide is bonded to metal at low-temperature by the method of metalorganic chemical spray pyrolysis. Using this method, metal precursors to the ceramic oxide composition are introduced as metalorganic salt complexes, (i.e., metal complexes having organic ligands), into an organic solvent. Together, they form the metalorganic precursor solution.

A distinguishing characteristic of metal-ceramic composites manufactured using the metalorganic spray pyrolysis process is that a direct rigid bond is formed between the metal and the ceramic members without the use of an adhesive or bonding agent that comprises a compositional state of matter that is different from the ceramic and the metal member, such as is the case when a solder material or a eutectic material is used to form the bond. By virtue of covalent bonding between the metal and the ceramic members, a compositional profile of the metal-ceramic interface is characterized by an abrupt termination of the metal composition and an equally abrupt beginning of the ceramic composition. These interfaces do not contain a formerly liquid phase material that has been solidified into a layer many tens of microns thick to form the bond. As will be shown below, this method of forming a "clean" interface now makes it possible to engineer micro-mechanical features bonded to the ceramic, but not to the metal, that enhance the interfacial properties of the composite body.

Figure 3:
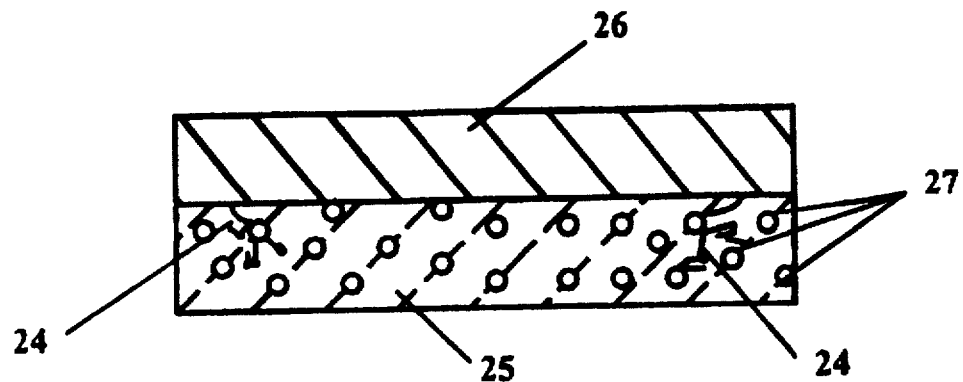
FIG. 3 represents a cross-sectional view of a metal-ceramic composite of the preferred embodiments of the present invention wherein particles of at least one secondary phase material are dispersed in the composite's ceramic member to impede crack propagation and increase crack-resistance.

One aspect of the present invention, shown in FIG. 3, is the incorporation of secondary phase material particles dispersed in a ceramic medium. For example, a crack 24 propagating through a brittle ceramic medium 25 that has been generated by stresses at the interface between the brittle ceramic medium 25 and a metal member 26 will be deflected or have its energy partially absorbed when it encounters the secondary phase material particles 27 dispersed in the brittle ceramic medium. As a result, the secondary phase material particles dispersed throughout a brittle medium increase the crack resistance of the brittle medium. The fracture mechanics of a composite body can also be improved if the composite body is formed in a manner that allows thermally compressive forces to pre-stress the composite body in a manner that opposes, much as is the case with a pre-stressed bolt, the thermal and mechanical loads anticipated from an intended application. Similarly, interfacial stress between a high thermal expansion coefficient metal and a lower thermal expansion coefficient ceramic can be reduced by modifying the Young's modulus of the high thermal expansion coefficient metal. Suitable modifications to the high thermal expansion coefficient metal would include perforating the high thermal expansion coefficient metal or by making it porous. As set forth below, the present invention allows any, or all, of these improvements now to be incorporated into the construction of metal-ceramic composite bodies.

A metal-ceramic composite with improved interfacial properties according to this invention can be manufactured as follows:

Specifically, the present invention utilizes a method to produce a metal-ceramic composite in which the ceramic member forms a covalent bond with the metal member by the method of metalorganic spray pyrolysis. The ceramic member consists of a primary ceramic medium with ultrafine subdivision that has been formed on the metal member from a spray pyrolyzed metalorganic solution, and the ceramic member contains a dispersion of previously formed particles of secondary phase materials that increase the crack resistance in the ceramic member. The particles 27 of secondary phase materials are dispersed in the ceramic medium by forming a colloidal suspension of the secondary phase materials in the metalorganic solution prior to spray pyrolyzing the metalorganic solution containing a colloidal suspension of the secondary phase material particles 27 on the metal member of the metal-ceramic composite. The metalorganic precursors are pyrolyzed into oxide ceramic on the metal member substrate heated to temperatures typically greater than 250° C., and typically less than 500° C. This range of temperatures is generally insufficient to dissolve the secondary phase material particles 27 into the ceramic medium 25. As a result, particles 27 of secondary phase materials dispersed throughout the metalorganic solution become dispersed, as secondary phase material particles, in the spray pyrolyzed ceramic. It is a preferred embodiment of this invention to use particulates of secondary phase materials that are characterized as having intrinsic mechanical properties that are less brittle, i.e., has a lower Young's modulus, than the ceramic medium 25 formed around them by the pyrolyzed metalorganic precursor solution. The secondary phase material particles 27 may comprise a metal or metal alloy, a glass phase, a shape memory alloy, graphite, an oxide or non-oxide material, or a crystalline ceramic or single crystal material phase.

This particular aspect of the invention has special significance for alumina-based ($Al_2O_3$-based) ceramic members on metal substrates. As mentioned above, the prior art instructs on the construction of metal-ceramic composites formed by bonding a previously formed ceramic member (i.e., a ceramic member that already has been sintered, cut, and polished) to metal sheets. Alumina represents one of the most highly refractory oxide ceramics. It liquefies at temperatures above 2054° C., and forms a partial liquid phase suitable for sintering at temperatures above 1828° C. Given these highly refractory properties, it is exceedingly difficult to disperse particles of a mechanically "softer" secondary phase material within a solid solution of alumina ceramic without completely dissolving the secondary phase material particles completely into a ceramic formed from sinter-reacted powders. The present invention allows a colloidal suspension of secondary phase material particles to be dispersed throughout a solid solution of ceramic that is spray pyrolyzed around the secondary phase material particles at temperatures well below 1828° C. The spray pyrolyzed ceramic may be crystallized and textured using a repetitive sequence of incremental reaction and mechanical swaging steps. During the formation of metal-ceramic composites that comprise a ceramic member possessing a thermal reaction temperature in excess of the melting temperature of the metal member to which it is bonded, it is preferred to utilize electromagnetic radiation to react and crystallize the ceramic member. In this embodiment a beam of electromagnetic radiation, characterized by an electromagnetic energy that is either in the microwave frequency spectrum or in the infrared frequency spectrum, can be directed onto the ceramic member to advance its state of crystallization. Simultaneously, the metal member, which is not irradiated by a suitably directed electromagnetic beam, can be held to a temperature well below its melting point. It is now well known to practitioners skilled in the art of microwave annealing of ceramic and other materials, that certain frequencies of radiation will preferentially react certain chemical species of the irradiated material. It is a preferred embodiment of this invention to utilize a microwave frequency that induces strong crystallization in the alumina ceramic, but induces only a mild reaction with the secondary phase materials particles. The secondary phase material particles may have spheroidal dimensions ranging between 0.05 microns and 500 microns. Secondary phase materials particles with spheroidal dimensions less than 0.05 microns will have a tendency to be dissolved into the ceramic medium into which they have been dispersed during reaction treatments. Secondary phase material particles with spheroidal dimensions greater than 500 microns are so large that their intrinsic material properties have a tendency to dominate over the material properties of the ceramic medium into which they have been dispersed. A preferred embodiment of the present invention utilizes the secondary phase material particles having spheroidal dimensions in the range between 0.10 and 50 microns.

It is often desirable to form a metal-ceramic composite comprising a metal member having a coefficient-of-thermal-expansion that is significantly greater than the coefficient-of-thermal-expansion of the ceramic member. As mentioned above, the thermal performance of the metal-ceramic composite composed of metal and ceramic members having incompatible coefficients of thermal expansion can be improved if the ceramic member in the metal-ceramic composite is maintained in a state of compressive stress over the range of temperatures at which the metal-ceramic composite is expected to operate. Such a state can be achieved if the metal member in the metal-ceramic composite is heated to a temperature that is greater than, or nearly equal to, the maximum temperature to which the pre-stressed metal-ceramic composite is expected to reach during an operational cycle prior to depositing the ceramic member on the metal member. It is a preferred embodiment of this invention to maintain the metal member and the deposited ceramic member at the elevated temperature until the pre-stressed metal-ceramic composite is fully constructed. Upon cooling to room temperature, the metal member in the pre-stressed metal-ceramic composite will contract to a much greater degree than the ceramic member, leaving the ceramic member in a state of compressive stress.

Figure 4:
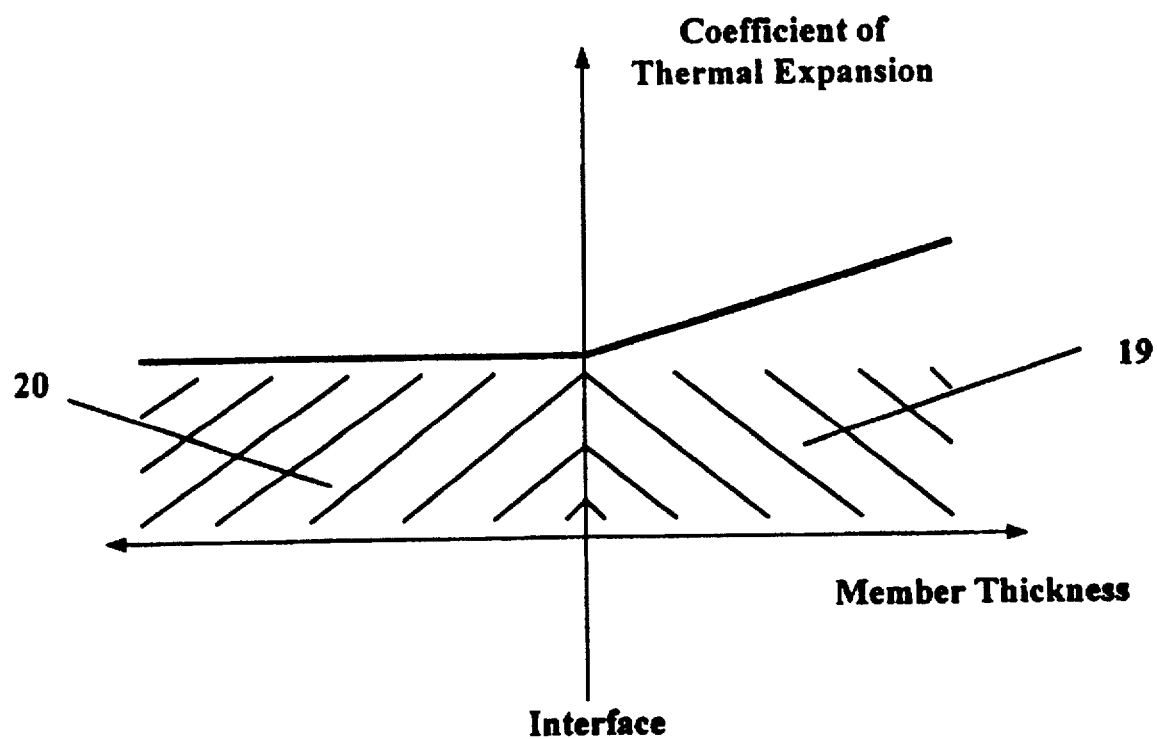
FIG. 4 represents a schematic cross-sectional view of the coefficient of thermal expansion witin a ceramic member.

Furthermore, since the metal-ceramic composite is produced by depositing the ceramic member on the metal member, the present invention provides other means to manipulate the stress response of the ceramic to steady-state thermal loads that induce a temperature differential across the deposited ceramic member. For instance, a heat shield, manufactured by bonding a high thermal conductivity metal sheet to a thermally insulating ceramic on one major surface and exposing the opposing major surface of the metal sheet to a heat source, can be used to diffuse heat to heat sinks located at the minor surfaces of the high thermal conductivity metal sheet, thereby impeding heat flow through the major surface at which the thermally insulating ceramic is bonded. Under steady-state conditions, the temperature of the thermally insulating ceramic member will be elevated to a higher temperature on the major surface at which it is bonded to the thermally conducting metal member, and be reduced to a lower temperature on its opposing major surface. As a consequence of this temperature profile across the thermally insulating member, the thermally insulating ceramic member will linearly expand to a greater degree at the major surface where it is bonded to the high thermal conductivity metal, and will linearly expand to a lesser degree if the thermally insulating ceramic member has uniform composition and an uniform coefficient-of-thermal-expansion. This difference in linear expansion produces a shear stress within the thermally insulating ceramic member having uniform coefficient of thermal coefficient. Under the present invention, the thermally insulating ceramic member is deposited on the metal member by spray pyrolyzing a solution of metalorganic precursors. The invention permits the composition of the ceramic member to be altered by adjusting the precursor concentration of the metalorganic solution with the thickness of the deposited ceramic. As shown graphically in FIG. 4, it is, thus, another preferred embodiment of the present invention to reduce shear stress in a ceramic member of a thermally loaded metal-ceramic composite by introducing a composition profile in the ceramic member 19 bonded to the metal member 20, to produce a gradient in the coefficient-of-thermal-expansion within the ceramic member in a manner that reduces shear stress in the ceramic member.

Another aspect of this invention is to reduce the Young's modulus or the effective coefficient-of-thermal-expansion of the metal member in the metal-ceramic composite having metal and ceramic members with incompatible coefficients of thermal expansion. It is a preferred embodiment of this invention to reduce the Young's modulus of the metal member having a coefficient-of-thermal-expansion that is significantly greater than the coefficient-of-thermal-expansion of the ceramic member to which it is bonded by drilling holes in the metal member. These holes can be drilled prior to forming the ceramic on the perforated metal member, or after the metal-ceramic composite has been formed by means of conventional press drilling or laser drilling.

Figure 5A:
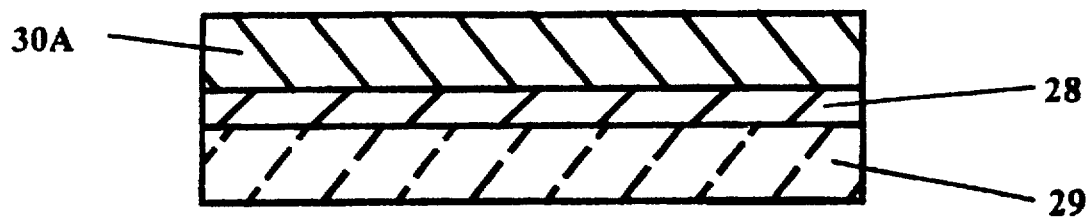
FIGS. 5 (a), (b) and (c) depict various positions of a constaining metal member within the composite of an embodiment of the present invention.
Figure 5B:
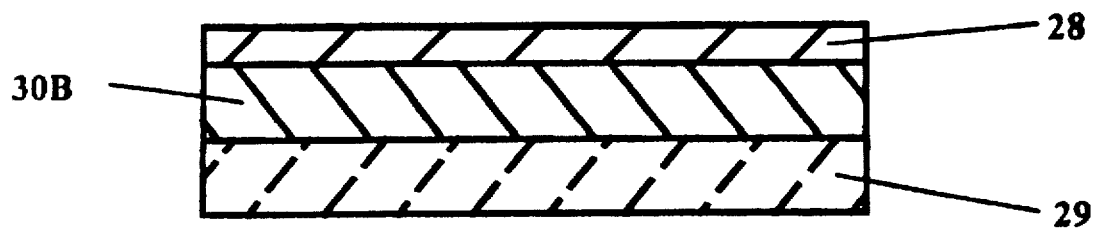
Figure 5C:
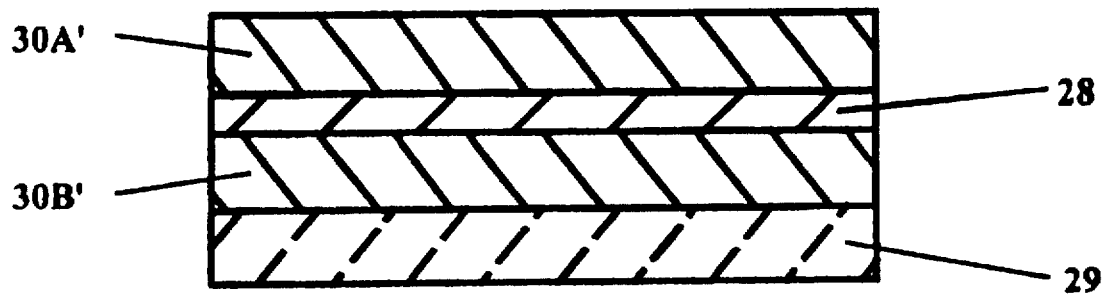

It is also a preferred embodiment of this invention to reduce the effective linear expansion of the metal member having a coefficient-of-thermal-expansion that is significantly greater than the coefficient-of-thermal-expansion of the ceramic member to which it is bonded in the metal-ceramic composite, by incorporating a constraining-metal member 28 into the metal member as shown in FIGS. 5 (a), (b) and (c), such that the constraining-metal member 28 incorporated into the metal member has a thickness that is $1/20^{th}$ to $1/3^{rd}$ the thickness of the metal member having a high coefficient-of-thermal-expansion. The constraining-metal member 28 may be situated such that it is bonded on one major surface to the deposited ceramic member 29, and bonded to the high coefficient-of-thermal-expansion metal member 30A on its other major surface as diagrammed in FIG. 5(a). The constraining-metal member 28 also may be situated such that it is bonded on one major surface to the high coefficient-of-thermal-expansion metal member 30B, and the high coefficient-of-thermal-expansion metal member 30B is bonded to the deposited ceramic member 29 on its other major surface as diagrammed in FIG. 5(b). Alternatively, the constraining-metal member 28 may be situated such that it is bonded on one major surface to a high coefficient-of-thermal-expansion metal member 30A', and is bonded to another high coefficient-of-thermal-expansion metal member 30B' on its other major surface, with the other high coefficient-of-thermal-expansion metal member 30B' bonded to the deposited ceramic member 29 on its other major surface as diagrammed in FIG. 5(c).

Figure 6A:
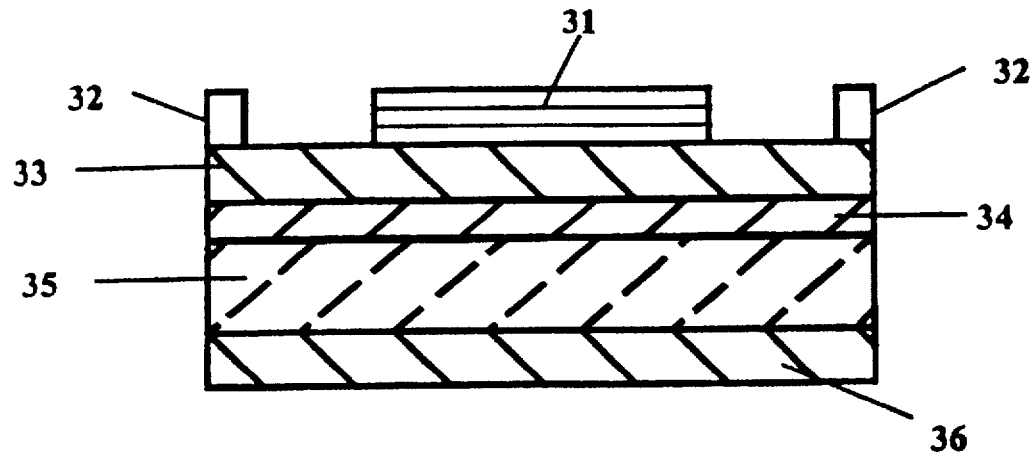
FIG. 6 (a) is a cross sectional view of a metal ceramic structure.

The present invention, by virtue of being a low-temperature manufacturing process, represents a further improvement over the prior art because it allows a far greater selection of high coefficient-of-thermal-expansion metal member bonded to constraining-metal member combinations to be constructed. Furthermore, in many applications for metal-ceramic composites it is desirable to couple a high thermal conductivity and/or electrical conductivity metal member to a thermally insulating and/or electrically insulating ceramic member. This is particularly true for metal-ceramic composites used as substrates in printed circuit board applications. In such instances, semiconductor integrated circuit elements are mounted on a metal member of the metal-ceramic composite substrate. The metal member is used to transport electrical current and also is used to dissipate heat generated by the SIC. In such applications it is particularly useful for the metal member to maximally dissipate heat and transport maximum levels of electrical current. As shown in Table I, metals that exhibit higher electrical and thermal conductivities commonly exhibit higher coefficients of thermal expansion, whereas metals with high yield strengths and low coefficients of thermal expansion, which are suitable for use as a constraining-metal member, typically exhibit poorer electrical and thermal conductivities. In order to achieve maximal operating performance in the printed circuit applications, it is preferable to configure the metal-ceramic composite with the constraining-metal member bonded between the ceramic member and the high thermal conductivity and/or high electrical conductivity metal member as shown in FIG. 6(a). It is straightforward to ascertain that the constraining-metal member in configurations of metal-ceramic composites such as those depicted in FIGS. 6(b), (c) will hinder the transport of electrical current to and from, or the dissipation of heat from, a semiconductor integrated circuit mounted on the exposed major surface of the metal member. However, in many practical applications it is preferable to utilize the less optimal configuration shown in FIG. 6(c) when the thermal expansion of, and stress distribution in, the metal-ceramic composite during an operational cycle is considered. These points are most clearly demonstrated using computer simulations that visually plot the stress distributions and mechanical deformation which results when a given composite design is subjected to a thermal load typical of an operational cycle.

TABLE I

| Material | Electrical Resistivity ($\Omega$-m) | Thermal Conductivity (Wm$^{-1}$K$^{-1}$) | Coefficient of Thermal Expansion ($10^{-6}$K$^{-1}$) | Poisson Ratio | Elastic Modulus | | Hardness |
|---|---|---|---|---|---|---|---|
| | | | | | Shear (GPa) | Tensile (GPa) | |
| Conducting Metal | | | | | | | |
| Aluminum | $2.65 \times 10^{-8}$ | 237 | 23.03 | 0.40 | 25 | 62 | 200 HV |
| Copper | $1.67 \times 10^{-8}$ | 401 | 16.5 | 0.343 | 46.8 | 125 | 37 HRB |
| Silver | $1.59 \times 10^{-8}$ | 429 | 19.2 | 0.37 | 46.3 | 125 | 25 HV |
| Gold | $2.35 \times 10^{-8}$ | 317 | 14.2 | — | — | 378 | — |
| Constraining Metal | | | | | | | |
| Antimony | $39 \times 10^{-8}$ | 243 | 8.5 | 0.25 | 19 | 77.7 | — |
| Chromium | $12.7 \times 10^{-8}$ | 93.7 | 8.5 | — | — | 154 | — |
| Iridium | $5.3 \times 10^{-8}$ | 147 | 6.2 | 0.26 | 0.21 | 1.2 | 200 HV |
| Molybdenum | $5.2 \times 10^{-8}$ | 138 | 5.43 | 0.307 | 107 | 350 | — |
| Tantalum | $12.45 \times 10^{-8}$ | 57.5 | 6.6 | 0.35 | 69 | 186 | 120 HV |
| Tin ($\alpha$-phase) | $11.0 \times 10^{-8}$ | 66.6 | 5.34 | 0.33 | 13.7 | 41.6 | — |
| Titanium | $42.0 \times 10^{-8}$ | 21.9 | 8.33 | 0.34 | 80 | 235 | 70 HB |
| Tungsten | $5.65 \times 10^{-8}$ | 174 | 4.59 | 0.28 | 155 | 400 | 150 HV |
| Vanadium | $24.8 \times 10^{-8}$ | 30.7 | 8.3 | 0.36 | 46.4 | 130 | 70 HB |
| Ceramic | | | | | | | |

TABLE I-continued

| Material | Electrical Resistivity (Ω-m) | Thermal Conductivity (Wm$^{-1}$K$^{-1}$) | Coefficient of Thermal Expansion (10$^{-6}$K$^{-1}$) | Poission Ratio | Elastic Modulus | | Hardness |
| --- | --- | --- | --- | --- | --- | --- | --- |
| | | | | | Shear (GPa) | Tensile (GPa) | |
| Alumina | 10$^{+18}$ | 0.42 | 8.8 | — | — | 0.04 | — |
| Ferrite | 4 × 10$^{-1}$ – 10$^{+10}$ | 4.0 | 7–10 | — | 36 | 0.02 | 6 (Mohs) |

FIG. 7 depicts magnified views of the structural response in 2 different configurations for metal-ceramic composite substrates in typical printed circuit board applications as simulated by finite element method ("FEM") analysis. The FEM analysis presented assumes the metal-ceramic composite structure sketched in FIG. 6(a). As shown on FIG. 6(a) the FEM model consists of a 150° C. heat source 31 to represent an SIC, and has heat sinking cooling fins 32 at the edge of a 3.00 mm thick copper mounting area 33, which is bonded to a 0.45 mm thick constraining-metal member 34. The constraining-metal member 34 is bonded through its opposing major surface to a 1.00 mm alumina ceramic member 35, which, in turn, is bonded through its opposing major surface to a 0.30 mm thick copper ground plane member 36. The model further assumes the materials properties for alumina, copper, molybdenum and titanium as tabulated in Table I. The outer edges of the model (including the cooling fins) are subject to an environmental load of 27° C. and convective heat loss of 4.33×10$^{-6}$ W/mm$^2$. The system has been allowed to relax to its steady-state equilibrium values to simulate conditions of maximal thermal loading.

Figure 6B:
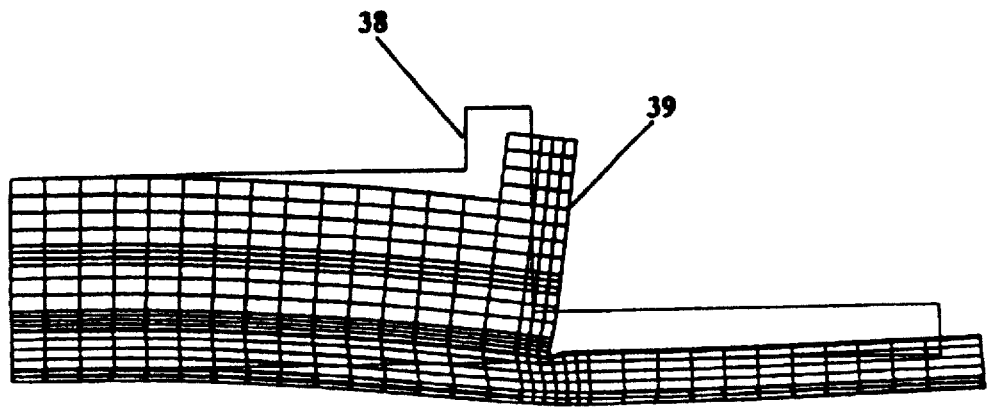

FIG. 6(b) depicts a magnified view (20×) of the FEM-simulated deformation to the metal-ceramic composite when the constraining-metal layer in the model comprises molybdenum. FIG. 6(b) models the molybdenum-containing composite in the symmetrical half-plane. As is clearly shown, the thermally loaded structure 37 is quite deformed from the stress-free structure 38. In this case, the molybdenum metal layer linearly expands at a rate ($\alpha_{molybdenum}$=5.43×10$^{-6}$° C.$^{-1}$) that is less than both the rates for the ceramic member ($\alpha_{alumina}$=8.8×10$^{-6}$° C.$^{-1}$) and the copper member ($\alpha_{copper}$=16.5×10$^{-6}$° C.$^{-1}$) to which it is attached. In fact, stress analysis shows that the von Mises stresses in a metal-ceramic composite printed circuit board substrate containing a molybdenum constraining-metal layer situated as depicted in FIG. 6(a) are, in fact, greater than the von Mises stresses for a metal-ceramic composite printed circuit board substrate that does not contain the molybdenum constraining-metal member.

Figure 6C:
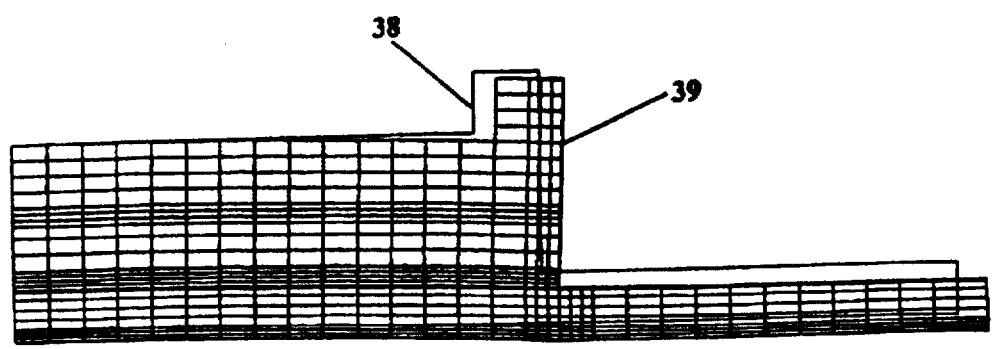

FIG. 6(c) depicts a magnified view (20×) of the FEM-simulated deformation to the metal-ceramic composite when the constraining-metal layer in the model comprises titanium. Again, FIG. 6(c) models the composite in the symmetrical half-plane. As is clearly shown, structural deformation to a metal-ceramic composite printed circuit board substrate containing a titanium constraining-metal member directly bonded to the ceramic member is generated by thermal loading 39 when compared to the stress-free structure 38. This deformation is greatly reduced when compared to the deformation generated in the thermally loaded metal-ceramic composite that contains a molybdenum constraining-metal member. Titanium has a coefficient-of-thermal-expansion ($\alpha_{titanium}$=8.33×10$^{-6}$° C.$^{-1}$) that is a far better match with alumina ($\alpha_{alumina}$=8.8×10$^{-6}$° C.$^{-1}$), and, as a result, reduces von Mises stress in the ceramic by more than 50%.

The improved structure cannot be reduced to practice using a high-temperature process, such as those described by the prior art. As reported by Kashiba et al., titanium and copper form an eutectic at temperatures greater than 880° C. Therefore, a process that requires a copper member to be mechanically pressed to a titanium member at a temperature of at least 900° C. for a period of at least 20 minutes will cause the members to form their eutectic and liquefy. Under the present invention, a covalent bond is formed between the deposited ceramic member and the metal member(s) at temperatures less than 550° C. As such, the present invention makes possible the construction of a much wider variety of high electrical or high thermal conductivity metal member bonded to constraining-metal member combinations. It is, therefore, a preferred embodiment of the present invention to deposit a ceramic member on a metallic member substrate, wherein the metallic member substrate comprises at least one high coefficient-of-thermal-expansion metal member consisting of a pure metal, metal alloy, or metal composite of aluminum, copper, silver, or gold, that is bonded, on at least one major surface, to a constraining metal member, wherein the constraining-metal member may comprise a pure metal, metal alloy or metal composite of antimony, chromium, iridium, molybdenum, tantalum, ($\alpha$-) tin, titanium, tungsten, or vanadium. The high coefficient-of-thermal-expansion metal member may be characterized as having a high electrical conductivity and/or high thermal conductivity. The constraining-metal member bonded to the metal member with a high coefficient-of-thermal-expansion may be characterized as having a coefficient-of-thermal-expansion that is less than the coefficient of expansion of the metal member to which it is bonded. It is preferred to have the constraining-metal member bonded to the metal member having a high coefficient-of-thermal-expansion through explosive pressure welding, or other metal-metal bonding techniques known to practitioners skilled in the art of metallurgy, prior to forming a covalent bond with the deposited ceramic member.

Figure 7A:
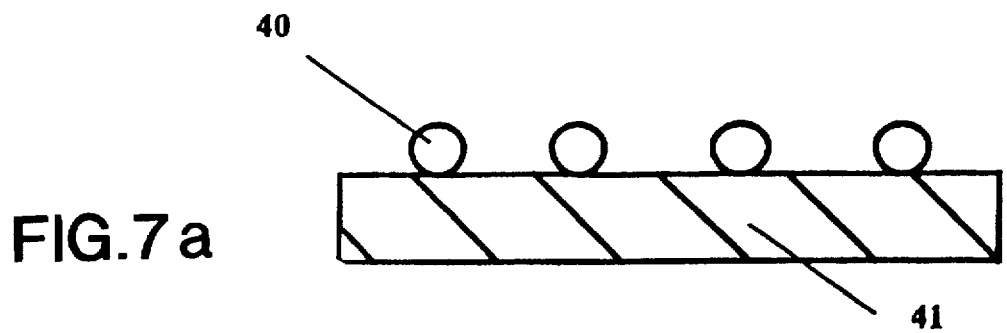
FIGS. 7 (a)–(d) depict cross-sectional views of the construction of a metal-ceramic composite in which adhesion-resistant bodies are placed on a metal member substrate (a), or coated with an epoxy resin before being attached to the metal member substrate (b), a ceramic member is deposited on both the adhesion-resistant bodies and the metal member substrate (c), and the resin epoxy is finally removed (d)
Figure 7B:
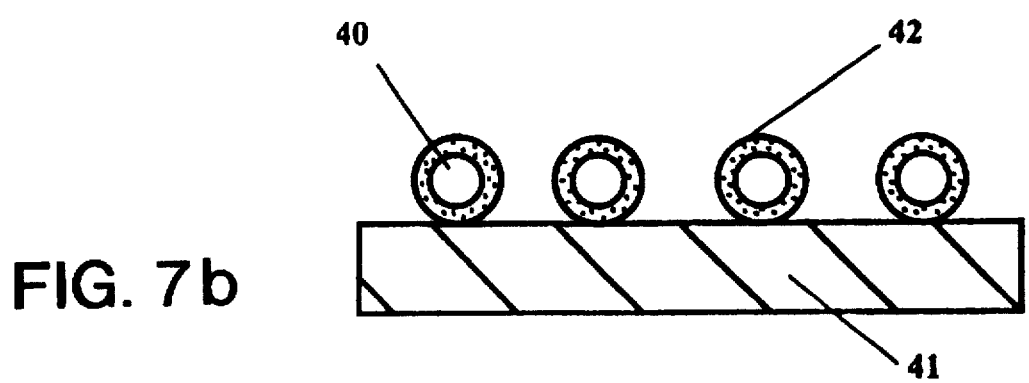
Figure 7C:
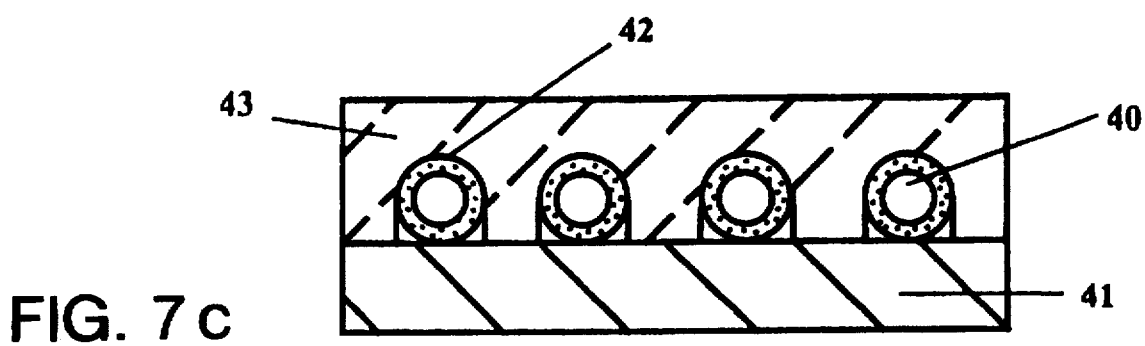
Figure 7D:
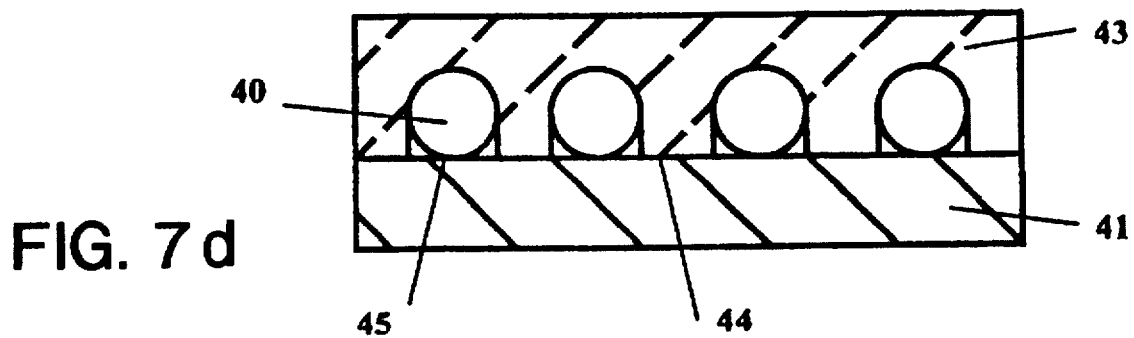

The ability to form a covalent bond between the deposited ceramic member and the metallic substrate without a molten bonding agent or adhesive, as is enabled under the present invention, permits even greater improvement to the prior art by introducing stress-reducing micro-mechanical elements to the interface. The present invention allows, as shown in FIG. 7(a) for at least one adhesion-resistant body 40 to be placed on the surface of the metal member substrate 41 onto which the ceramic member will be deposited prior to depositing the ceramic member. The adhesion-resistant body can be blown off the surface of the metal member substrate during the ceramic deposition process, therefore it is a preferred embodiment of this invention to physically secure the at least one adhesion-resistant body on the surface of the metal member substrate without forming a permanent bond between the at least one adhesion-resistant body and the metal member substrate by coating the adhesion-resistant body with a resin epoxy 42 as shown in FIG. 7(b)) that decomposes at temperatures greater than the substrate deposition temperature to which the metal member substrate is heated during the ceramic deposition process. The ceramic member 43 as shown in FIG. 7(c) is then spray pyrolyzed from a metalorganic solution on to the metal member substrate 41 and the at least one adhesion-resistant body 40 physically attached to or placed on the metal member substrate and processed to form the metal-ceramic composite. After the deposited ceramic member 43 has been formed to a sufficient thickness on the metal member substrate and the at least one adhesion-resistant body, the entire metal-ceramic composite can be heated to a temperature that decomposes the resin epoxy 42 that physically secures the at least one adhesion-resistant body to the metal member substrate, (typically to a temperature in the range between 450° C. to 550° C.), to produce a metal-ceramic composite in which a rigid covalent bond has been formed between the metal member substrate 41 and the deposited ceramic member 43 only at those regions of the metal-ceramic interface that are not occupied by the at least one adhesion resistant body 44 as shown in FIG. 7(d). If the adhesion-resistant body is composed of a material composition and phase that does not liquefy and form a rigid bond through molten action, regions 45 of the metal-ceramic interface that are occupied by the at least one adhesion resistant body will not be bonded to the adhesion-resistant body, nor to the deposited ceramic layer. The adhesion-resistant body 40 will be allowed to slip relative to displacements or linear expansions of the metal member substrate 41 at the non-bonded regions 45 of the metal-ceramic interface. Thins embodiment of the present invention cannot be produced using metal-ceramic bonding techniques, such as eutectic bonding or active metal/solder bonding, which form the bond through a liquefied or molten phase that, when pressed, is smeared, and forms a rigid bond when cooled, across the entire bonding surface.

The cross-sectional geometry of each adhesion-resistant body need not be circular as depicted in drawings and may assume any cross-sectional geometry that improves the crack-resistance of the deposited ceramic member, or reduces the stress distribution within the metal-ceramic composite. The cross-sectional geometry for the adhesion-resistant body can be determined for a given application using computer simulation by any practitioner skilled in the art of finite element method analysis. Similarly, the at least one adhesion-resistant body need not be a discrete body, but a series of continuous bodies, such as whiskers, platelets or fibers. For instance, a fiber or wire mesh can be utilized to pattern a adhesion-resistant body grid at the metal-ceramic interface. In certain specific applications specific patterns of adhesion-resistant bodies, which might comprise adhesion-resistant bodies of differing cross-sectional geometry, or a combination of discrete and continuous adhesion-resistant bodies of varying shapes and sizes, are preferred.

Figure 8A:
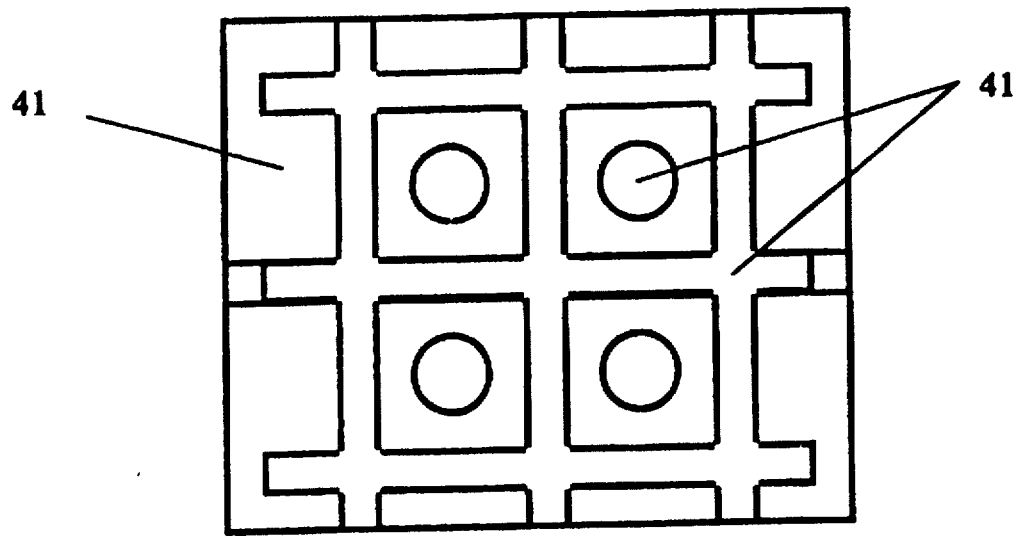
FIGS. 8 (a) and (b) show the top perspective of various shapes and forms for adhesion-resistant bodies.
Figure 8B:
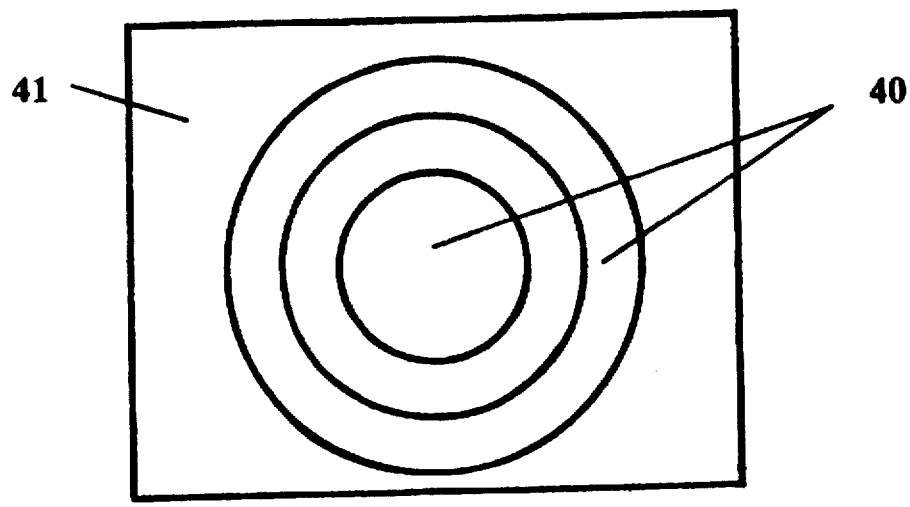

FIGS. 8 (a) and (b) represent top perspectives of some, but by no means all, representative patterns of adhesion-resistant bodies 40 on metal member substrates 41 that may be useful. Such patterns of adhesion-resistant bodies can be fixed on the surface of the metal member substrate using a variety of means, including, but not limited to, screen printing or other printing techniques such as, letterpress, gravure, rotogravure, dot and or jet printing. A particular pattern of adhesion-resistant bodies will, of course, be dependent upon on the thermal and/or mechanical loads of a specific application, and can be determined using computer simulation by any practitioner skilled in the art of finite element method analysis or other computer simulation methods. The use of adhesion-resistant bodies to construct a metal-ceramic composite with improved interfacial properties in any pattern is considered an element of, and as having been instructed by, the present invention.

The adhesion-resistant bodies may be produced from a variety of materials that do not liquefy or form a molten or rigid bond with the metal member to which the adhesion-resistant bodies are contacted in a metal-ceramic composite. Therefore, its is recommended to compose the adhesion-resistant bodies from a material that melts at temperatures greater than the maximum temperatures (450°–880° C.) to which the metal-ceramic composite may be exposed the adhesion-resistant bodies may be composed of materials that comprise, but are not limited to, metals or metal alloys, a glass phase, a shape memory alloy, graphite, an oxide or non-oxide material, or a crystalline ceramic or single crystal material phase.

Figure 9A:
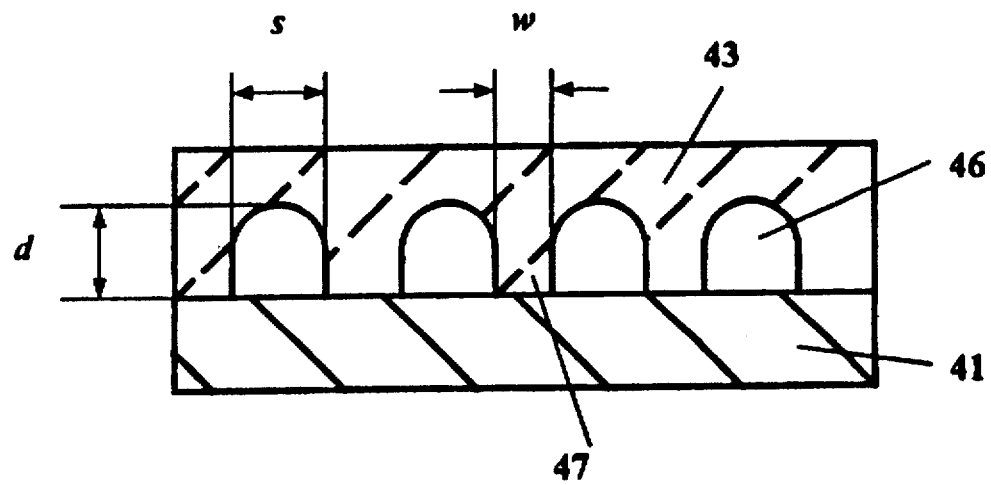
FIGS. 9 (a) and (b) depict various parameters that define a micro-mechanical strut at a metal-ceramic oxide interface (a) and the flexure the micro-mechanical struts provide to the ceramic at the interface (b)
Figure 9B:
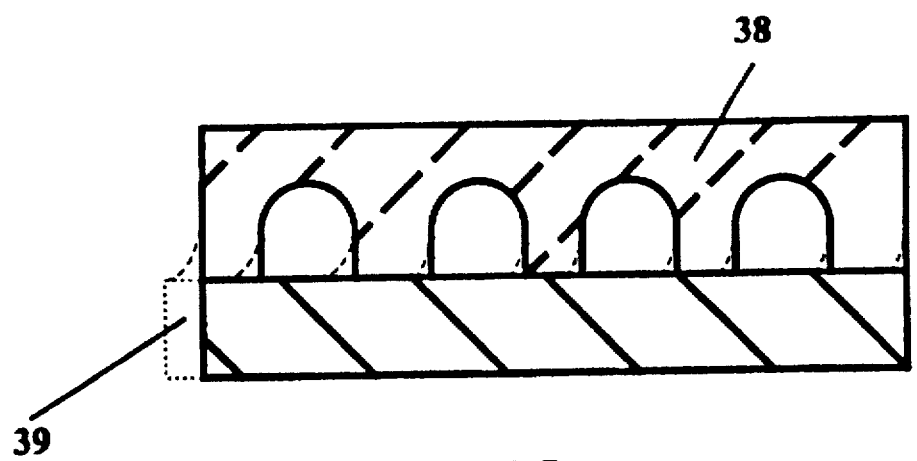
Figure 10:
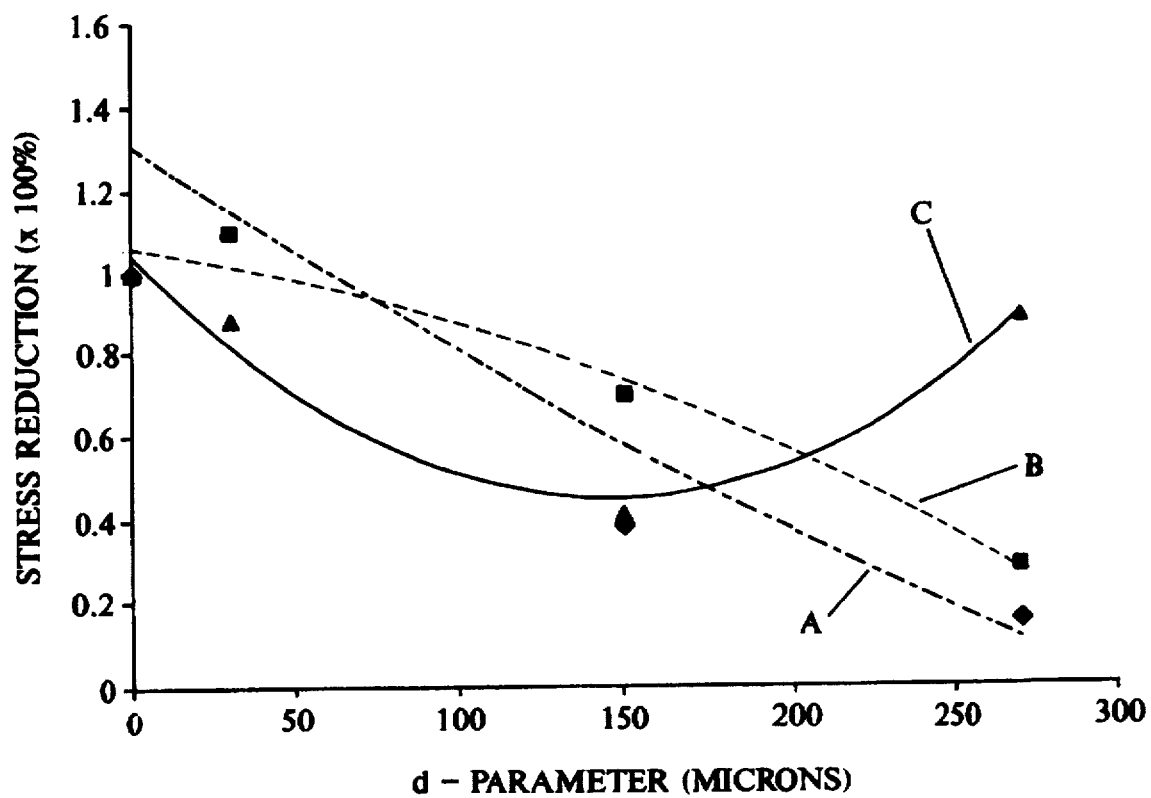
FIG. 10 shows the characteristic stress-reduction versus the depth of micro-mechanical struts formed in the ceramic member at various distances from the metal-ceramic interface.
Figure 11:
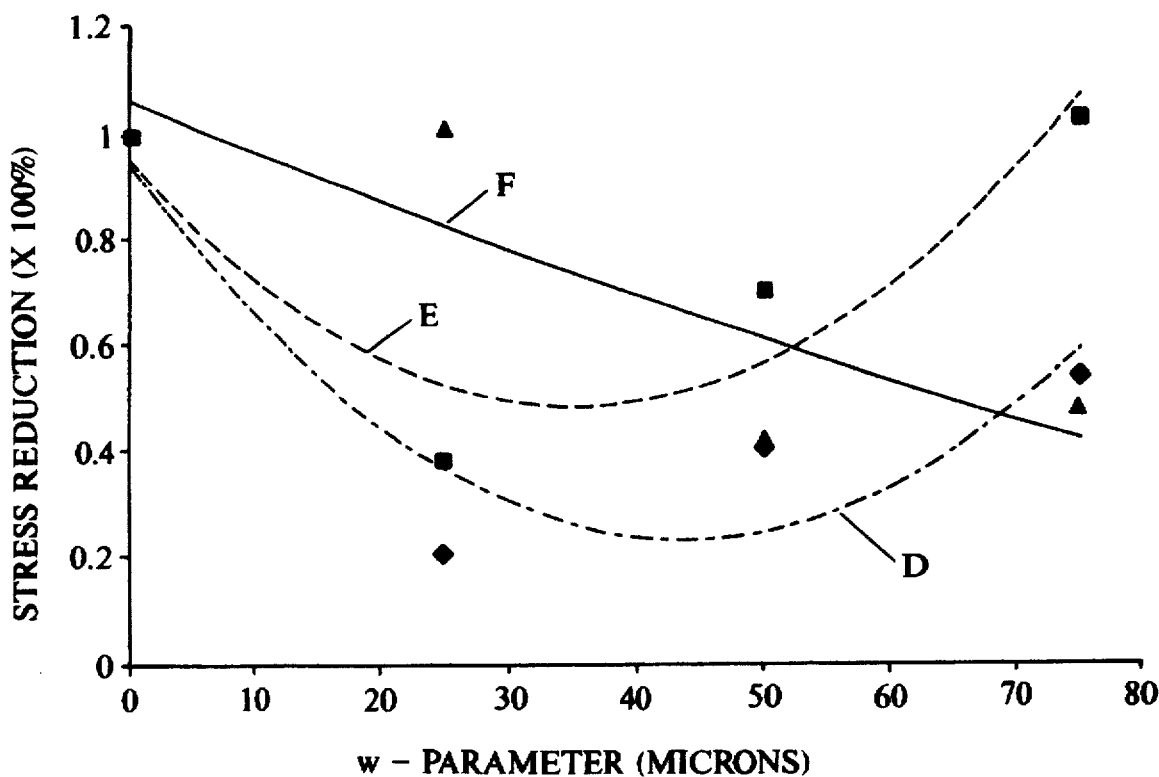
FIG. 11 shows the characteristic stress-reduction versus the width of micro-mechanical struts formed in the ceramic member at various distances from the metal-ceramic interface.

As shown in FIGS. 9 (a) and (b) it is another preferred embodiment of this invention to utilize adhesion-resistant bodies composed of a material phase that can be selectively etched or removed from the metal-ceramic composite after processing to produce voids 46 in the deposited ceramic member 43 bonded to the metal member substrate 41 of the metal-ceramic composite where the selectively etchable adhesion-resistant bodies were originally located as shown in FIG. 9(a). This aspect of the invention allows micro-mechanical struts 47 to be produced in the ceramic member that can flex in response to lateral displacements of the bonded metal member caused by linear expansions or contractions of the bonded metal member. FIG. 9(b) depicts the flexure in a thermally loaded composite 39 compared to its stress-free state 38. The flexure provided by the micro-mechanical struts in the ceramic member reduces the shear stresses normally generated in the interior of a bonded ceramic member which typical induce cracking of the bonded ceramic member. The degree of stress reduction in the bonded ceramic member is dependent upon the physical dimensions of the micro-mechanical struts, which may be defined as having a width, w, a depth, d, and a spacing, s as shown in FIG. 9(a). FIG. 10 graphically depicts characteristics curves for the stress reduction in the ceramic member at distances of 20 microns A, 52 microns B, and 185 microns C versus the depth parameter (d-parameter) of micro-mechanical struts that have a width (w-parameter) of 50 microns, and a spacing (s-parameter) equal to 50 microns. FIG. 11 depicts characteristics curves for the stress reduction in the ceramic member at distances of 20 microns D, 52 microns E, and 185 microns F versus the width parameter (w-parameter) of micro-mechanical struts that have a depth (d-parameter) of 150 microns, and a spacing (s-parameter) equal to 50 microns.

Hygroscopic glass materials are preferred for use as the selectively etchable adhesion-resistant body materials used to produce patterns of voids and micro-mechanical struts in the bonded ceramic member. Hygroscopic glass materials can be dissolved in water without risking erosion of the composites metal and ceramic members by simply immersing the composite into an aqueous ultrasonic bath medium. Glass materials can be easily shaped into microscopic geometries and patterns using methods well known to practitioners skilled in the art of producing optical fiber, fiber-optic bundles, and micro-optical components. It is a preferred embodiment of this invention to utilize phosphate-based and or borate-based hygroscopic oxide glasses as the selectively etchable adhesion-resistant bodies.

EMI Resistant Panels

A particular aspect of the metal-ceramic composites of the present invention relates to the use of the metal-ceramic composites as a device to absorb or shield electromagnetic radiation. The device comprises a lossy ferrite ceramic bonded to a metallic substrate. The lossy ferrite ceramic serves as a microwave field attenuator and absorbs microwave signals directed towards, converting the absorbed microwave signal into heat. The metallic substrate serves to dissipate the generated heat. Ferrite absorption of microwave frequencies relate to magnetic dipoles within the ferrite that become resonant with the applied microwave field. The power of the electromagnetic field is absorbed as it excites a resonant response in the ferrite ceramic. Power absorption by a ferrite ceramic can be made to be particularly acute to a certain frequency using an applied magnetic field.

Ferrite ceramics, like ferrous metals, are magnetic materials, and, as a result will retain a remnant field when magnetized. Many applications for the microwave field attenuating devices requires the devices to be situated in close proximity to electronic circuitry, with which an applied or remnant magnetic field could interfere. Ferrite ceramics have much lower magnetic permeabilities than ferrous metals, and, as such are preferred in applications that might be sensitive to a nearby magnetized member. Therefore, it is a preferred embodiment of this invention to engineer the material properties of the ferrite ceramic to have strong microwave absorption (high loss) at high (microwave) frequencies with minimal applied or remnant magnetic fields.

Figure 12:
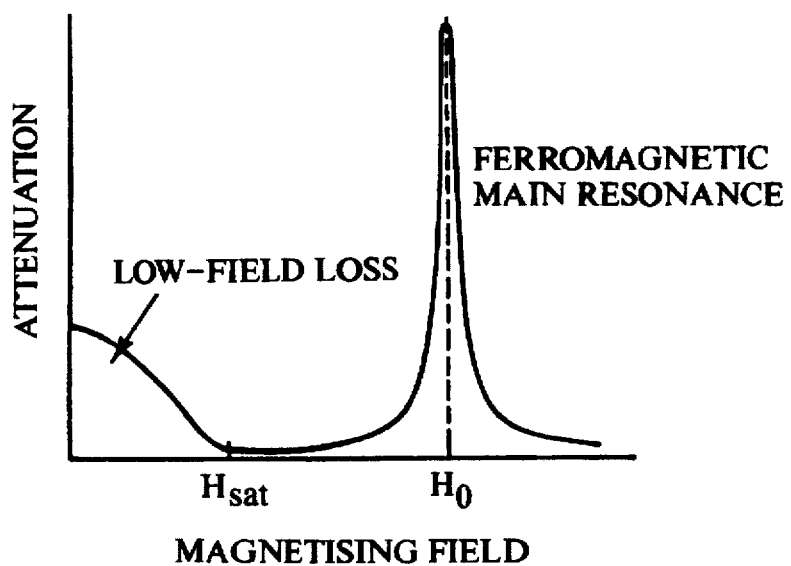
FIG. 12 depicts low-field losses characteristic to ferrite ceramics.

Ferrites exhibit high loss under low (or zero) applied magnetic fields through a mechanism known as low-field loss as shown in FIG. 12. Loss mechanisms driving low-field losses occur over a frequency range $\omega_{min}$ and $\omega_{max}$, defined as:

$$\omega_{min}=\gamma H_a,  \qquad (2a)$$

and, $$\omega_{max}=\gamma(H_a+M_o/\mu) \qquad (2b)$$

where $\gamma$ is the gyromagnetic factor, $H_a$ is crystalline anisotropy field of the ceramic, $M_o$ is the saturation magnetization of the ceramic, and $\mu$ is the magnetic permeability of the ceramic. If the metal-ferrite ceramic composite device is designed to operate at a characteristic frequency, $\omega_{op}$, the intrinsic properties of the ferrite ceramic member in the composite should be such that the characteristic frequency, $\omega_{op}$, should be within the range of low-field losses defined by $\omega_{min}$ and $\omega_{max}$. Therefore, for the metal-ferrite ceramic composite device to function effectively at $\omega_{op}$, the ferrite ceramic member must have a crystalline anisotropy field, $H_a$, a saturation magnetization, $M_o$, and a magnetic permeability, $\mu$, such that $$H_a \leq \omega_{op}/\gamma \leq H_a+M_o/\mu. \qquad (3)$$

It is a preferred embodiment of the invention that the thickness of the ferrite ceramic member be less than 2.0 mm. Signal attenuation, $\alpha_{loss}$, in a ferrite ceramic can evaluated from the magnetic permeability, $\mu$, electrical permittivity, $\epsilon$, and the loss tangent, tan $\delta$, (the ratio of the imaginary component to the real component of the magnetic permeability), calculated as, $$\alpha_{loss}=\frac{1}{2}\omega_{op} (\mu\epsilon) [(1+\tan \delta^2)^{1/2}-1]^{1/2}. \qquad (4)$$

As such, in order to be at least partially effective in absorbing electromagnetic radiation, the ferrite ceramic member should have a loss tangent, such that tan $\delta > 3$, and a real permeability $\mu'$ and electrical permittivity $\epsilon$, such that, $\mu' \cdot \omega_{op}^2 > 10,000/\epsilon$. It is preferred that the metal member in the metal-ferrite ceramic have a thickness in the range between 0.01 mm to 5.00 mm, and that the thickness of the ferrite ceramic be in the range between 0.1 mm to 5.0 mm.

Figure 13:
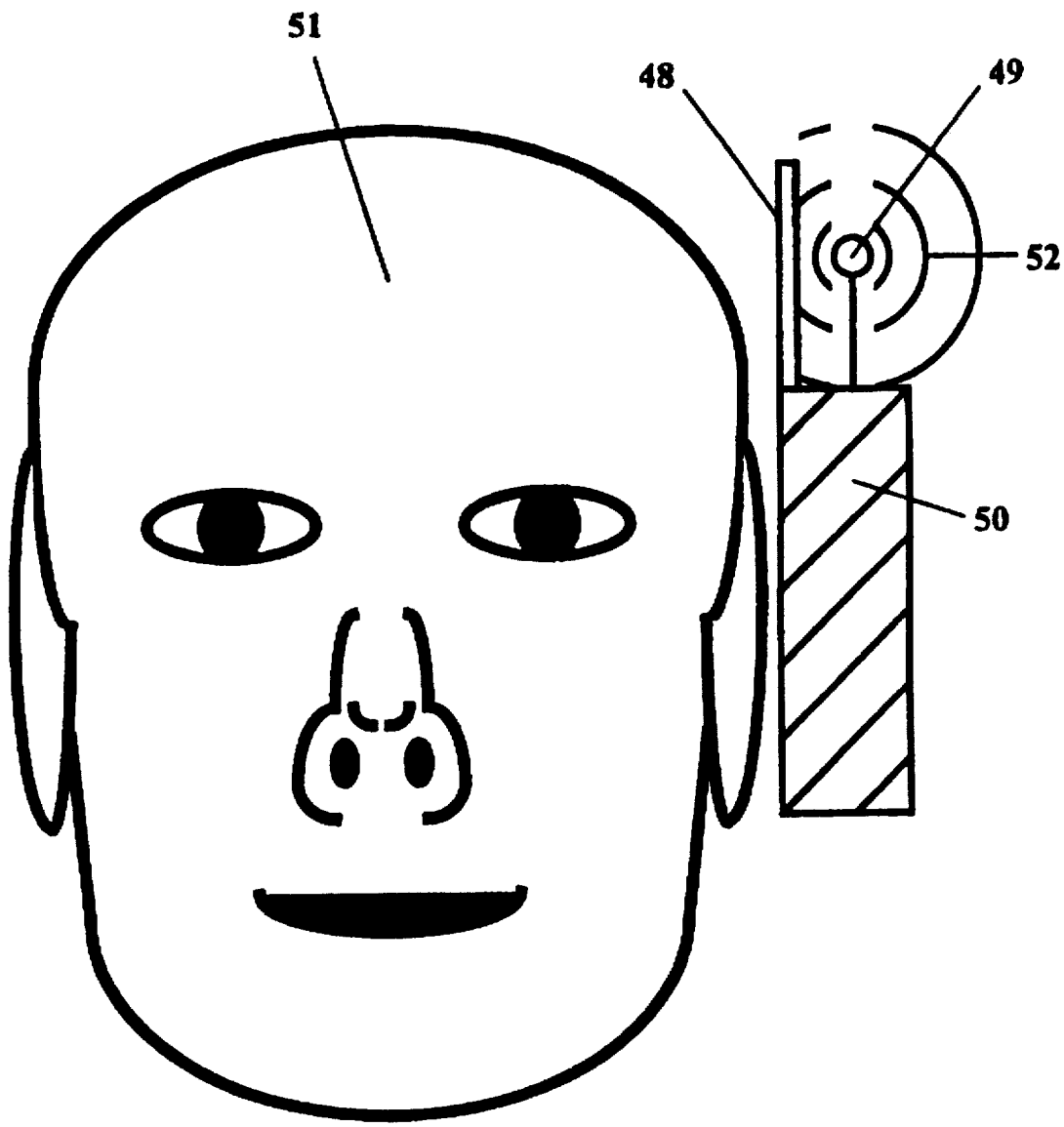
FIG. 13 depicts the use of a metal-ferrite ceramic composite to shield a human brain from potential harmful electromagnetic emissions emanating from a cellular telephone.

As shown in FIG. 13 a preferred application for the metal-ferrite ceramic composites is in cellular telephones as a device that reduces the exposure of the human brain to potentially harmful microwave emissions. In the application, the metal-ferrite ceramic composite device 48 is inserted to a position that normally locates it between a radiating element 49 of the cellular telephone unit 50 and a human head 51, such that it protects the human head against potentially harmful electromagnetic waves 52 emanating from the radiating element. Cellular telephones operating over the frequency spectrum allocated for personal communications systems ("PCS") transmissions emit microwave radiation at powers of at least 600 milliwatts at 1.8 GHz. It is therefore a preferred embodiment of the present invention to select ferrite ceramics having a combination of intrinsic material properties that efficiently absorb radiation at a characteristic frequency of $\omega_{op}=2\pi \cdot 1.8$ GHz, or $11.3 \times 10^9$ s$^{-1}$.

High frequency (microwave) signal loss in ferrite ceramics increases when the grain sizes in the ceramic are large and densely packed. The present invention is particularly useful in producing large densely packed ceramic grains bonded to a thermally conductive metal substrate. Certain metal oxide additives also promote the growth of large grains in ferrite ceramics. One can incorporate additives of manganese, vanadium, niobium, lead, copper, antimony and/or titanium oxides into the primary (ferrite) ceramic phase of the metal-ferrite ceramic composite device. The primary phase plus the additive oxides forming a solid solution under pryolysis heating and/or subsequent processing conditions.

Printed Circuit Boards

Another particular aspect of the metal-ceramic composites of this invention relates to the use of the metal-ceramic composites as a metal-ceramic composite substrate for printed circuit boards. As discussed above, metal-ceramic composite substrates for printed circuit boards comprise a high conductivity metal sheet member, commonly a copper sheet on which semiconductor integrated circuits are eventually mounted. The metal sheet member is bonded on a major surface to an insulating ceramic member with a low-dielectric constant, typically alumina, which, in turn, is bonded on its opposing major to another high conductivity metal (copper) sheet. The copper sheet upon which SIC's are eventually mounted is required to satisfy certain tolerances for the metal-ceramic composite substrate to operate reliably as a printed circuit board, and may contain a constraining-metal member to reduce its effective coefficient-of-thermal-expansion.

Tolerances relating to the surface roughness of the metal member on which SIC's are mounted require the metal member to have at least a median surface roughness of 3 microns and a maximum surface of 18 microns, although a median surface roughness of 1 micron and a maximum surface roughness of 8 microns are preferred. It is also preferable to chemically polish the metal member in a mixture of sulfuric acid and hydrogen peroxide for a period of 1 to 5 minutes to attain a surface finish within these tolerances. Tolerances relating to the Vickers hardness of the metal member on which SIC's are mounted require the metal member to have a Vickers hardness that is at least in the range of 40–100 Kg/mm$^2$, although a Vickers hardness in the range of 60–80 Kg/mm$^2$ is preferred.

Metal-ceramic composites formed by spray pyrolyzing the ceramic member on the metal member from a metalorganic precursor solution permits the production of metal-ceramic-metal composite sheet structures by pressing together two composites ceramic face to ceramic face, wherein the composites comprise a ceramic member deposited on a metal member substrate. The pressed metal-ceramic-metal composite is then thermomechanically calcined to form a uniformly rigidly bonded structure. This application of the present invention is suitable for composites structures in which the ceramic members can be sintered at temperatures less than the melting point of the metal member substrates. This is not possible with copper-alumina-copper structures, wherein the alumina member needs to be sintered at a temperature of at least 1828° C., which is well above the melting point of copper at 1083° C.

Figure 14:
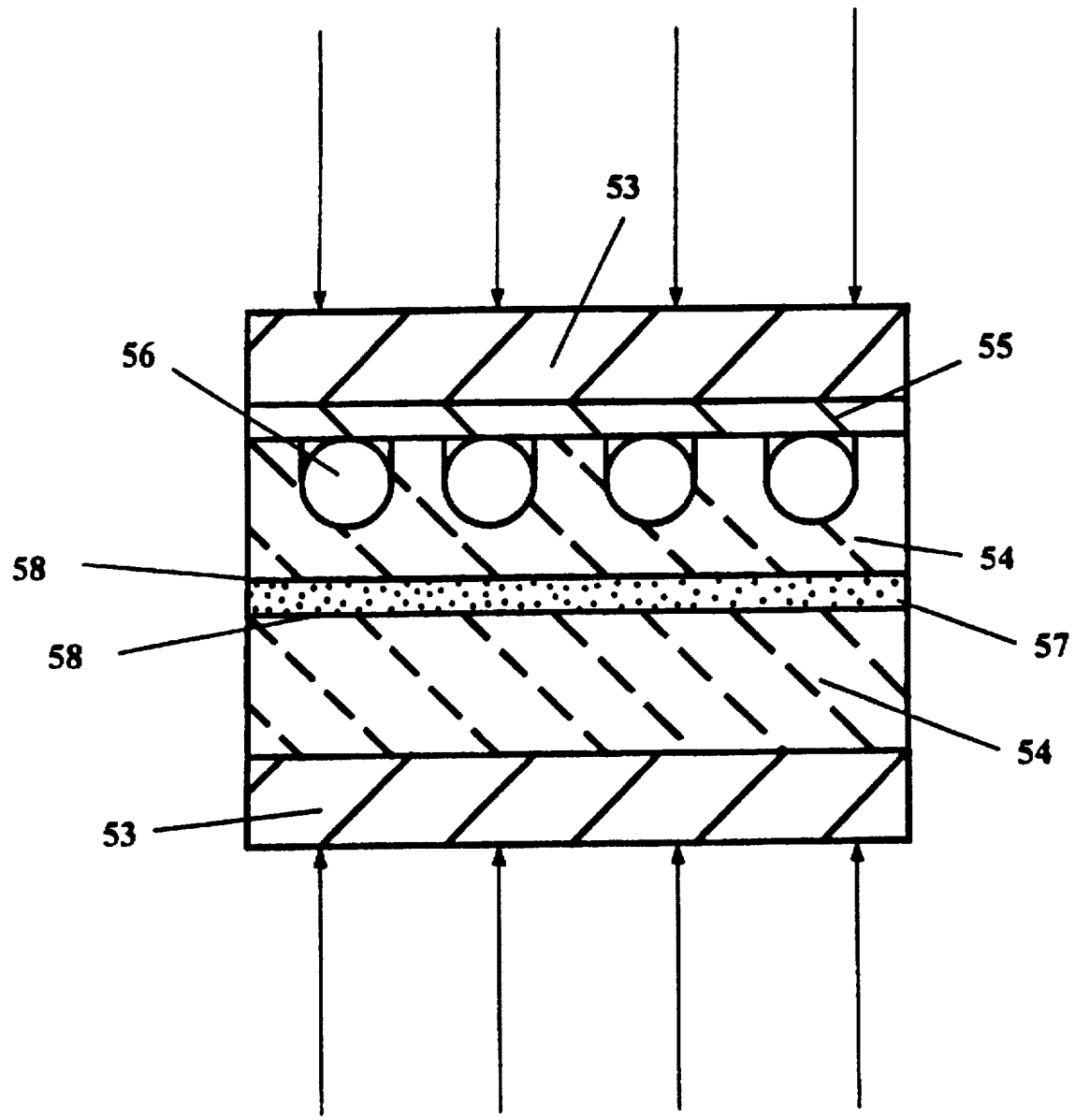
FIGS. 14 and 15(a) and (b) depict metal-ceramic composite substrates for printed circuit applications.
Figure 15A:
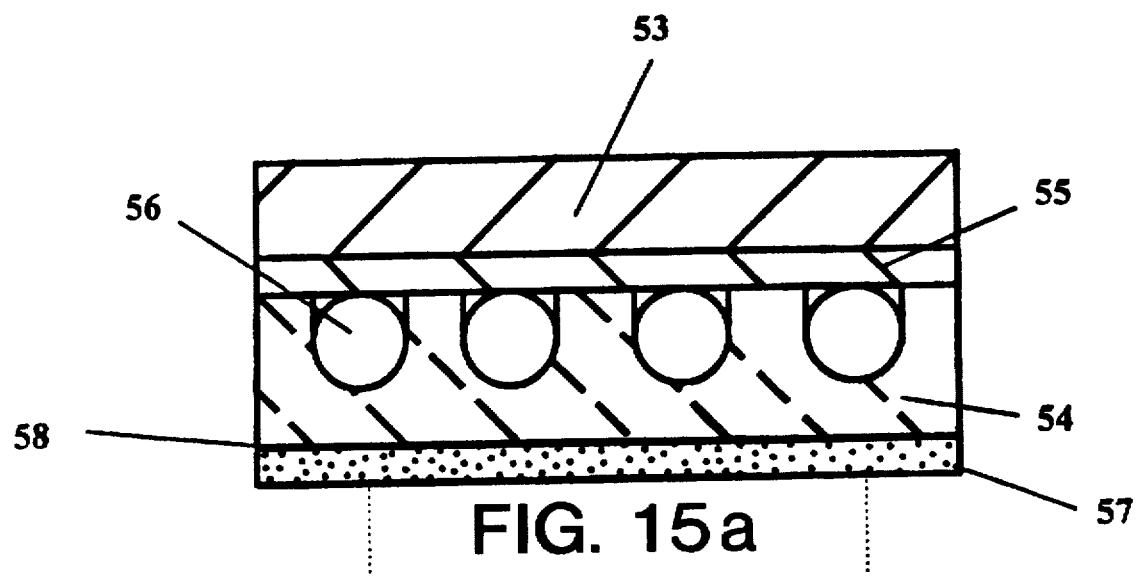
Figure 15B:
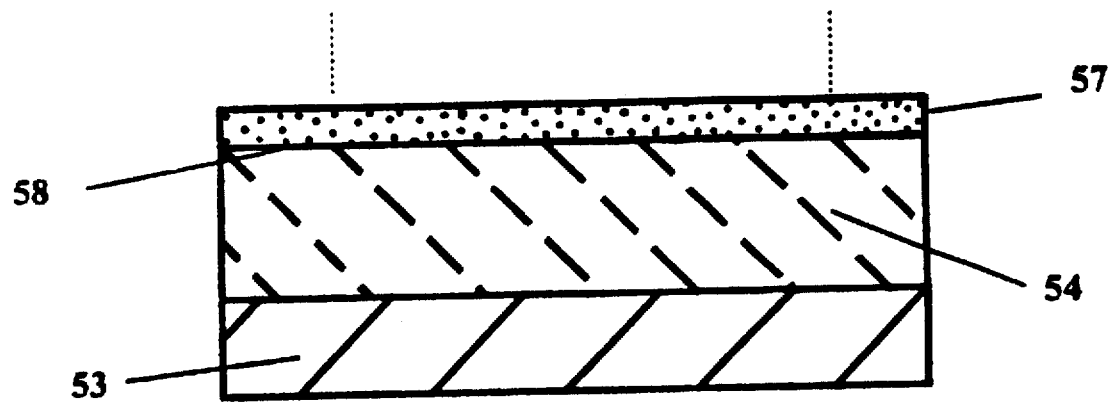

Also under the present invention, high conductivity metal-alumina-high conductivity metal, such as copper-alumina-copper structures, with improved crack-resistance and interfacial properties are produced by depositing an alumina-based ceramic on the high conductivity metal member. As shown in FIGS. 14 and 15(a) and (b) it is another preferred embodiment of the present invention for the high conductivity metal member substrate 53 upon which an alumina ceramic member 54 is deposited to contain a constraining-metal member 55, and for adhesion-resistant bodies 56 to be implanted at the interface between the metal member substrate and the deposited ceramic member. A similarly made metal-alumina ceramic composite, which may or may not contain the constraining-metal member 55 or the adhesion-resistant bodies 56, is produced to bond with the other metal-alumina ceramic composite. Low temperature (<880° C.) bonding is achieved by introducing a layer of low-melting temperature oxide or oxyfluoride phase materials 57 that form a molten liquid phase at temperatures below 880° C. on the bonding surfaces 58 of at least one the metal-alumina ceramic composites. The low-temperature oxide or oxyfluoride phases may be introduced to the bonding surface as metalorganic precursors of the spray pyrolyzed solution, as secondary phase material particles dispersed in the metalorganic solution, as secondary phase material particles not dispersed in the metalorganic solution but still applied to the bonding surfaces 58, are as an active metal film or powders that are oxidized. In printed circuit board applications it is desirable for the bonded alumina ceramic member to have a low dielectric constant, it is, therefore, preferable to use light atomic weight metal oxides. It is a preferred embodiment of this invention to utilize an phospho-alumino-borate glass phase as the low-temperature oxide bonding layer. Borate glass melts at temperatures as low as 450° C., but is sensitive to chemical attack by water. Phosphoric anhydride typically melts in the range of 580°–585° C. Incorporating alumina into phosphate and borate oxide glasses increases chemical resistance and intrinsic strength. Aluminophosphate glass phases typically melt at temperatures ranging from 660°–1575° C. Thus, it is preferable to add borate glass phases to the low-temperature bonding materials when the metallic substrate member in the bonded metal-ceramic composite contains an aluminum member which melts at 660° C. Additions of alkali oxides or alkali fluorides are useful in depressing the melting temperature of the low-temperature oxide bonding agent, but will also decrease its resistance to chemical attack by water.

It is a further preferred embodiment of this invention for the low melting temperature oxide bonding layer to have a thickness in the range of 1 micron to 150 microns. The two metal-alumina ceramic composites, with at least one of the metal-alumina ceramic composites containing a low-temperature oxide bonding agent on its bonding surface, are then heated to at least a temperature above which the low-temperature oxide bonding agents forms a molten phase. The two metal-alumina ceramic composites are then joined at their bonding surfaces and pressed together at a pressure between 0.5 and 25 MPa. When cooled, a rigid oxide bond is formed between the two metal-alumina ceramic composites at the bonding surfaces to form the finished conducting metal-alumina ceramic-conducting metal composite. It is generally preferred that the two different metal members in a composite substrate for printed circuit board applications be made to different thickness and mechanical specifications. These differences need to be considered prior to forming the final bonded composite. It is, therefore, a preferred embodiment of this invention to form the composite substrate using one metal-alumina ceramic composite that contains a conducting metal member bonded to a constraining metal member, wherein the thickness of the constraining-metal member is in the range between 0.015 mm to 1.67 mm, and the total (combined) thickness of the conducting metal member(s) is in the range between 0.30 mm to 5.00 mm; and, another metal-alumina ceramic composite that contains a conducting member in the range of 0.01 mm to 0.3 mm. The alumina-ceramic members on each of the two metal-ceramic composites may vary such that the combined thickness of alumina ceramic in the bonded metal-ceramic-metal composite is in the range between 0.3 to 1.0 mm. It is, thus, preferred that the thickness of the ceramic member in the metal-ceramic composites be in the range of 0.15 to 0.85 min.

Figure 16A:
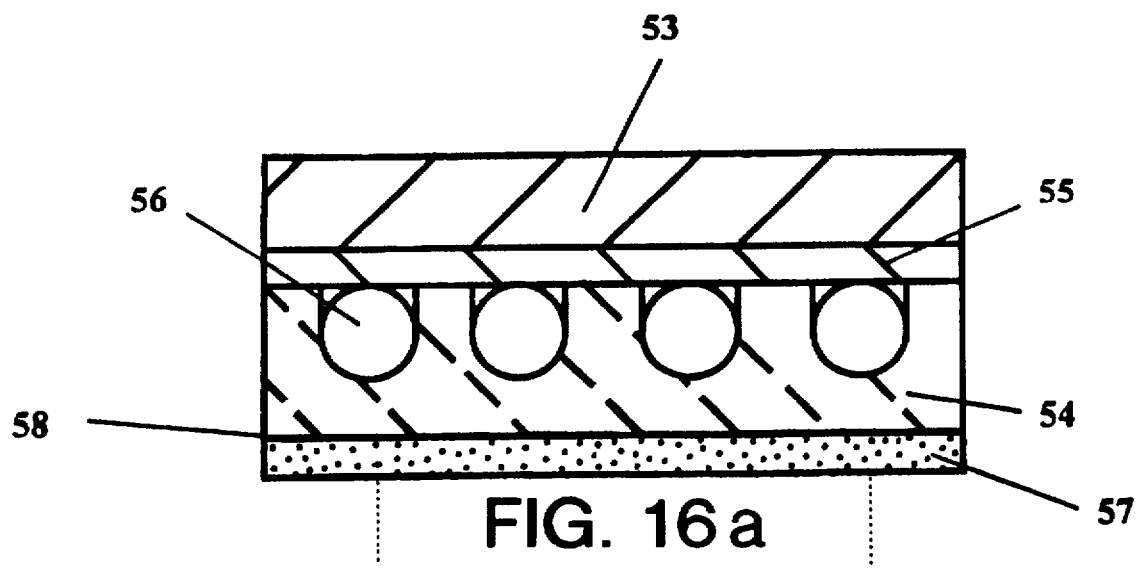
FIGS. 16(a) and (b) and 17 and depict metal-ceramic composites with a ferrite ceramic attached to one major surface of the structure.
Figure 16B:
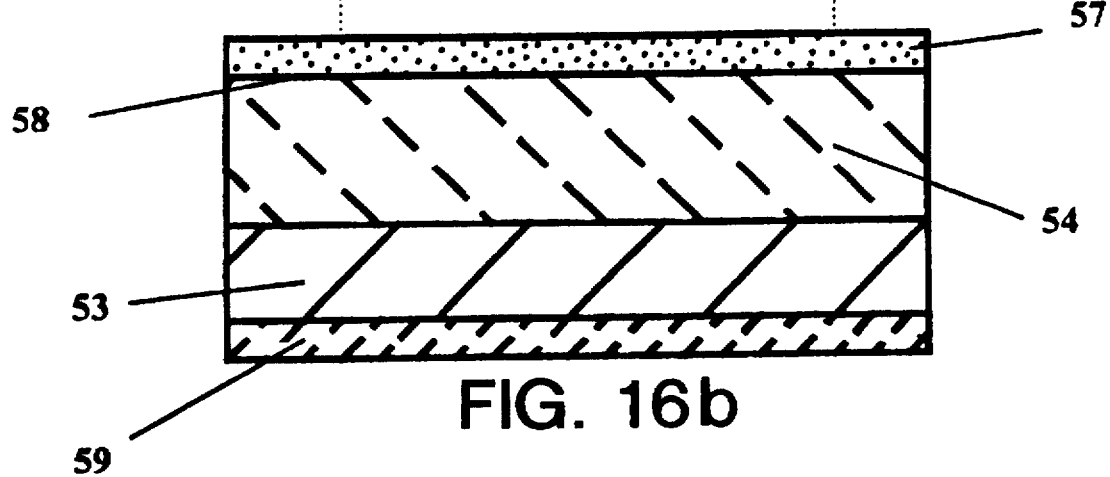
Figure 17:
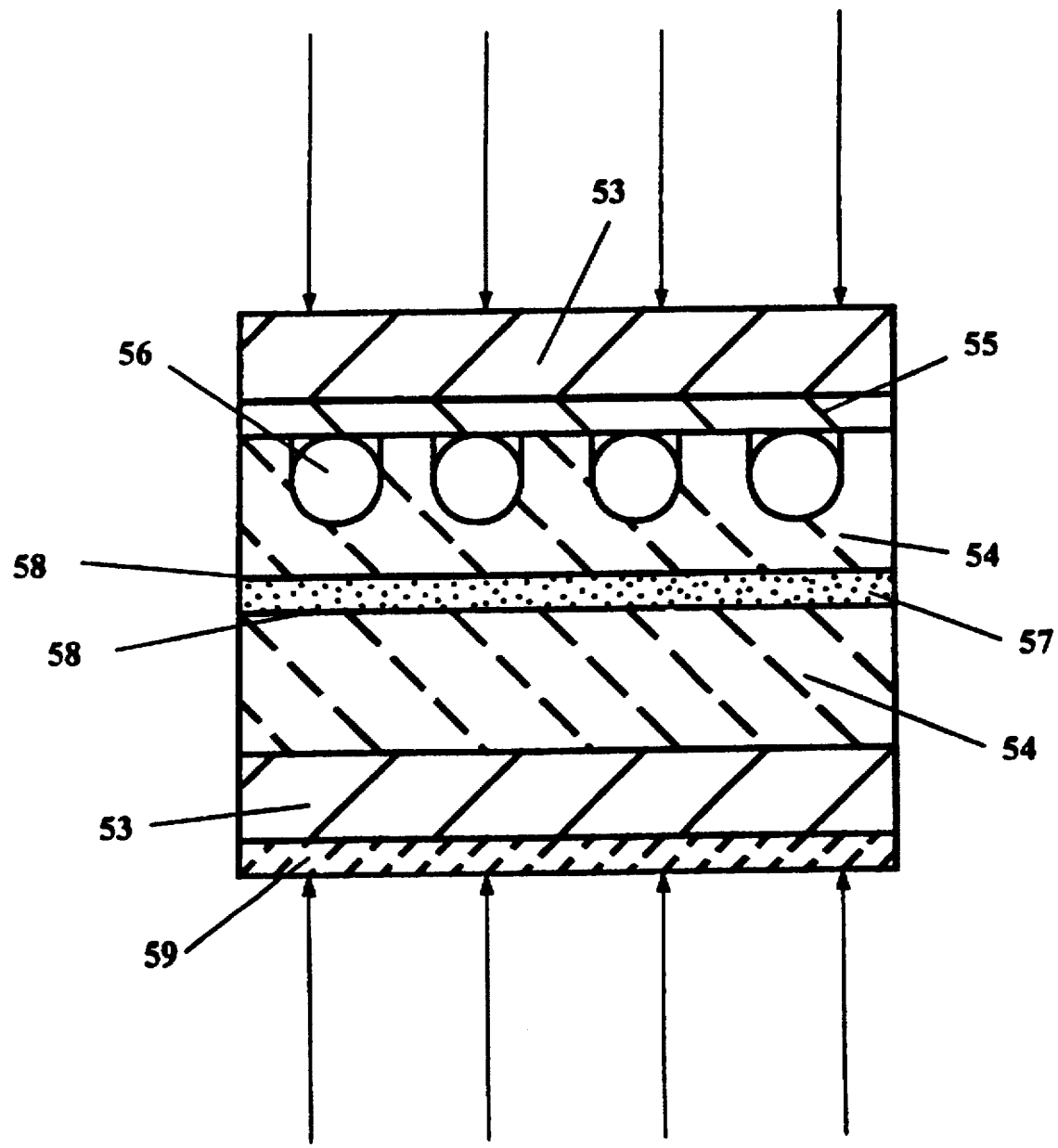

Yet another particular subject of the present invention relates to the incorporation of a ferrite ceramic member into a metal-ceramic composite substrate for printed circuit board applications. In many applications, semiconductor integrated circuits mounted on a printed circuit board substrate may actually become radiators of harmful electromagnetic radiation, or be exceptionally sensitive to such emissions. Thus, as shown in FIGS. 16(a), (b) and 17, it is desirable to have an element in close proximity to the SIC that would absorb the electromagnetic radiation. Under the present invention a lossy ferrite ceramic member 59 can be bonded to a major surface of a high conductivity metal sheet, which is then used, on its opposing major surface, as the metal member substrate for a deposited alumina ceramic member. The ferrite ceramic-metal-alumina ceramic member is then bonded into a metal-ceramic composite substrate suitable for printed circuit board applications using the art described above.

A further particular subject of the present invention relates to the production of a metal-porous ceramic composite, wherein the porous ceramic member has ultrafine subdivision. In certain applications it is desirable for the metal-ceramic composite to function simultaneously as a heat shield and as a sound absorber. A porous ceramic member can function both as a thermally insulating member and as a sound absorber. Porous ceramics are also preferred forms of ceramic in the application of metal-ceramic composites as electrochemical electrodes. Large organic molecules, such as carboxylic acids, generate considerable water and carbon dioxide/carbon monoxide during thermal decomposition. The formation of a porous ceramic on a metal substrate is readily realized by spray pyrolyzing carboxylic acid salt precursors to the ceramic as the metalorganic solution. Under this aspect of the present invention, mechanical swaging steps are omitted. It may also be preferable to introduce other foaming agents to the metalorganic precursor solution, such as polyurethanes, polyvinylchorides, polyethylenes, pentanes, hexanes, or polypropylenes, that further increase the foaming actions during the deposition process.

Although the invention has been described with reference to particular embodiments, it will be understood that this invention is also capable of further and other embodiments within the spirit and scope of the appended claims.

What is claimed is:

1. A printed circuit board comprising a metal member directly bonded to a ceramic member via a covalent bond, the bond being formed at less than 500° C., the metal member and the ceramic member providing heat dissipation for at least one SIC mounted on the metal member and the metal member providing electrical conductivity for the at least one SIC mounted on the metal member, the metal member having a 3 microns or less surface roughness and a hardness of 40 to 100 Kg/mm$^2$, the ceramic member comprising a ceramic medium whose precursors have been mixed at the molecular level.

2. The printed circuit board of claim 1 wherein the ceramic comprises an oxide.

3. The printed circuit board of claim 2 wherein the oxide is $Al_2O_3$.

4. The printed circuit board of claim 1 wherein the ceramic member is composed of the ceramic medium containing particles of a secondary phase material dispersed therein to arrest crack propagation.

5. The printed circuit board of claim 4 wherein the secondary phase material has a Young's modulus different than Young's modulus of the ceramic medium.

6. The printed circuit board of claim 1 as made by dispersion of at least one metal organic precursor on a surface of the metal member and pyrolysis of the same at 500° C. or less.

7. The printed circuit board of claim 6 as so made and with the further step of thermomechanical densification of the ceramic.

8. The printed circuit board of claim 6 wherein the dispersion is accomplished by spray application.

9. A laminated printed circuit board comprising two of the printed circuit boards of claim 1 bonded ceramic face-to-ceramic face to establish a complete metal-ceramic-metal printed circuit board.

10. A laminated printed circuit board as in claim 9 with an intermediate bonding agent between the bonded faces.

11. The printed circuit board as in claim 1 with cavities in the ceramic member adjacent the metal member.

12. The printed circuit board as in claim 11 wherein said cavities form micromechanical struts in said ceramic layer that can flex in response to lateral displacement of said bonded metal layer caused by linear expansions or contractions of said bonded metal layer.

13. The printed circuit board as in claim 11 with said cavities in the ceramic member formed by including adhesion resistant pieces at preselected locations on a metal surface of the metal member, depositing at least one metal organic precursor at other than said preselected locations on the metal surface and utilizing pyrolysis to form the metal-ceramic covalent bond, except where ceramic adhesion is blocked by the adhesion resistant pieces, and dissipating the pieces to leave said cavities.

14. The printed circuit board as in claim 13 wherein the adhesion resistant pieces comprise hygroscopic glass.

15. The printed circuit board as in claim 1 with holes (perforations) in the metal member to reduce effective differences between Young's modulus and/or coefficient of thermal expansion of the metal member and such property or properties of the ceramic member.

16. The printed circuit board as in claim 1 wherein the ceramic member is porous.

17. The printed circuit board as in claim 16 further comprising adhesion-resistant pieces on the metal member and being exposed to the ceramic member.

18. The printed circuit board as in claim 17 with means for attaching the adhesion-resistant pieces to the metal member.

19. The printed circuit board as in claim 16 wherein the metal member comprises a high electrical and/or thermal conductivity material selected from the group consisting of:

(a) elemental metals, (b) metal alloys, and (c) metal composites of aluminum, copper, gold, or silver, bonded to a constraining-metal member that is 1/20th to 1/3rd the thickness of the high electrical and/or thermal conductivity metal member, wherein the constraining-metal member comprises a metal, metal alloy, or metal composite, of antimony, chromium, iridium, molybdenum, tantalum, tin, titanium, tungsten, or vanadium.

20. The printed circuit board as in claim 1 wherein the metal member comprises a high electrical and/or thermal conductivity material selected from the group consisting of:

(a) elemental metals, (b) metal alloys, and (c) metal composites of aluminum, copper, gold, or silver, bonded to a constraining-metal member that is 1/20th to 1/3rd the thickness of the high electrical and/or thermal conductivity metal layer, wherein the constraining-metal member comprises a metal, metal alloy, or metal composite, of antimony, chromium, iridium, molybdenum, tantalum, tin, titanium, tungsten, or vanadium.

21. The printed circuit board as in claim 1 wherein said ceramic layer provides for EMI shielding.

22. A printed circuit board comprising a metal member with a surface portion bonded directly to a multi-ceramic-component ceramic layer via a covalent bond and another distinct surface portion of the metal member being bonded to a SIC mounted on the metal member, the covalent bond being formed at less than 500° C., the metal layer and the ceramic layer providing heat dissipation for said SIC mounted on the metal member and the metal member providing electrical conductivity for said SIC, and the ceramic layer being made of a multi-ceramic-component medium whose precursors have been mixed at the molecular level at the metal surface as applied and pyrolized simultaneously during application to avoid segregation or sequential decomposition of mixed species of ceramics and their precursors.

* * * * *